(12) United States Patent
Taniguchi et al.

(10) Patent No.: US 7,445,674 B2
(45) Date of Patent: Nov. 4, 2008

(54) CRYSTALLIZATION APPARATUS, CRYSTALLIZATION METHOD, DEVICE, OPTICAL MODULATION ELEMENT, AND DISPLAY APPARATUS

(75) Inventors: Yukio Taniguchi, Yokohama (JP);
Masayuki Jyumonji, Yokohama (JP);
Hiroyuki Ogawa, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 665 days.

(21) Appl. No.: 11/087,619

(22) Filed: Mar. 24, 2005

(65) Prior Publication Data

US 2005/0217571 A1    Oct. 6, 2005

(30) Foreign Application Priority Data

Mar. 31, 2004    (JP)    ............................. 2004-103373

(51) Int. Cl.
*C30B 15/26*    (2006.01)
*C30B 11/00*    (2006.01)

(52) U.S. Cl. ................... 117/201; 117/202; 117/203; 117/204

(58) Field of Classification Search .......... 117/201–204
See application file for complete search history.

(56) References Cited

U.S. PATENT DOCUMENTS

| | | | |
|---|---|---|---|
| 7,011,709 B2 * | 3/2006 | Taniguchi et al. | 117/200 |
| 7,101,436 B2 * | 9/2006 | Taniguchi et al. | 117/200 |
| 7,214,270 B2 * | 5/2007 | Taniguchi et al. | 117/201 |
| 7,227,679 B2 * | 6/2007 | Taniguchi | 359/279 |
| 7,239,374 B2 * | 7/2007 | Taniguchi et al. | 355/69 |
| 2004/0005744 A1 * | 1/2004 | Taniguchi et al. | 438/166 |
| 2004/0036969 A1 * | 2/2004 | Taniguchi et al. | 359/443 |
| 2005/0153552 A1 * | 7/2005 | Akita et al. | 438/689 |
| 2005/0162632 A1 * | 7/2005 | Taniguchi et al. | 355/69 |
| 2005/0179885 A1 * | 8/2005 | Taniguchi | 355/67 |

(Continued)

FOREIGN PATENT DOCUMENTS

CN    1476552 A    2/2004

OTHER PUBLICATIONS

H. Ogawa, et al., "Growth of Large Si Grains at Room Temperature by Phase-Modulated Excimer-Laser Annealing Method", IDW'03 Proceedings of the 10th International Displat Workshops, 2003, pp. 323-326.

Masakiyo Matsumura, "Preparation of Ultra-Large Grain Silicon Thin-Films by Excimer-Laser", Journal of the Surface Science Society of Japan, vol. 21, No. 5, 2000, pp. 278-287.

(Continued)

*Primary Examiner*—Robert M Kunemund
*Assistant Examiner*—G. Nagesh Rao
(74) *Attorney, Agent, or Firm*—Oblon, Spivak, McClelland, Maier & Neustadt, P.C.

(57) ABSTRACT

A first optical modulation element irradiates a non-single-crystal substance with a light beam which is to have a first light intensity distribution on the non-single crystal substance by modulating an intensity of an incident first light beam, thereby melting the substance. A second optical modulation element irradiates the substance with a light beam which is to have a second light intensity distribution on the substance by modulating an intensity of an incident second light beam, thereby melting the substance. An illumination system causes the light beam having the second light intensity distribution to enter the molten part of the substance in a period that the substance is partially molten by irradiation of the light beam having the first light intensity distribution.

9 Claims, 20 Drawing Sheets

U.S. PATENT DOCUMENTS

| | | | |
|---|---|---|---|
| 2006/0027162 A1* | 2/2006 | Kato et al. | 117/92 |
| 2006/0044565 A1* | 3/2006 | Matsumura et al. | 356/464 |
| 2006/0177973 A1* | 8/2006 | Taniguchi et al. | 438/166 |
| 2007/0188840 A1* | 8/2007 | Taniguchi | 359/238 |
| 2007/0211327 A1* | 9/2007 | Taniguchi et al. | 359/238 |
| 2007/0215037 A1* | 9/2007 | Taniguchi | 117/92 |

OTHER PUBLICATIONS

H. Ogawa, et al., "Growth of Large Si Grains at Room Temperature by Phase-Modulated Excimer-Laser Annealing Method", IDW'03 Proceedings of the 10th International Displat Workshops, 2003, pp. 323-326.

* cited by examiner

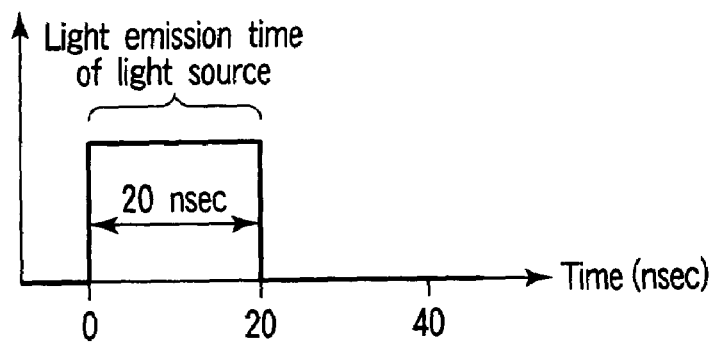
F I G. 5A
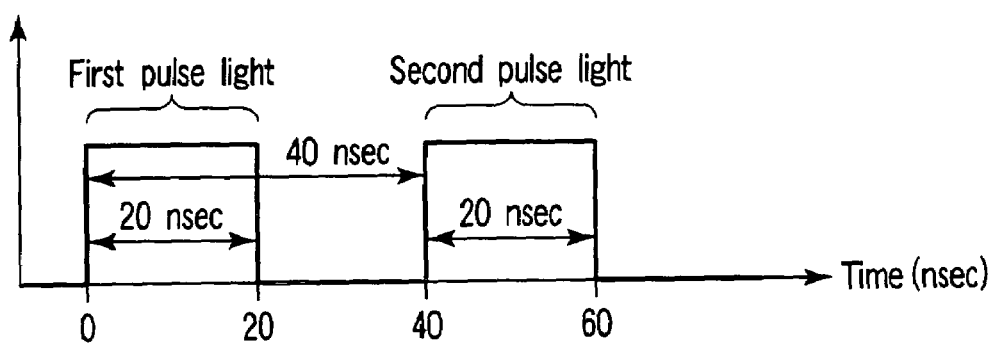
F I G. 5B

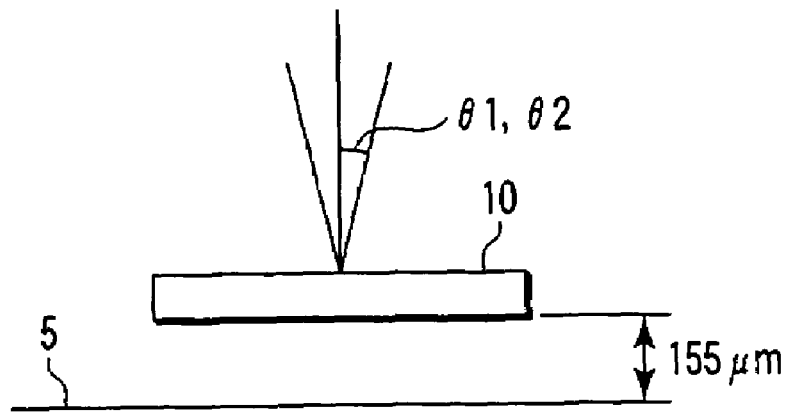
F I G. 9A
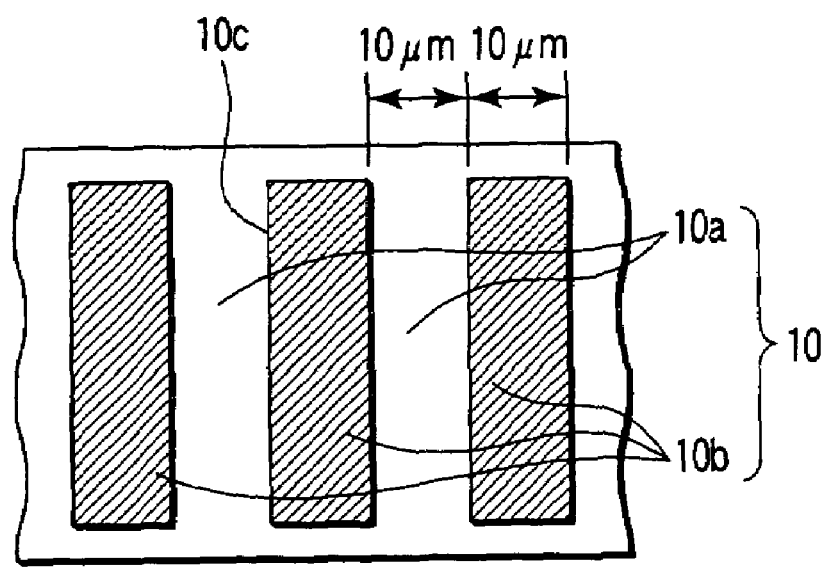
F I G. 9B

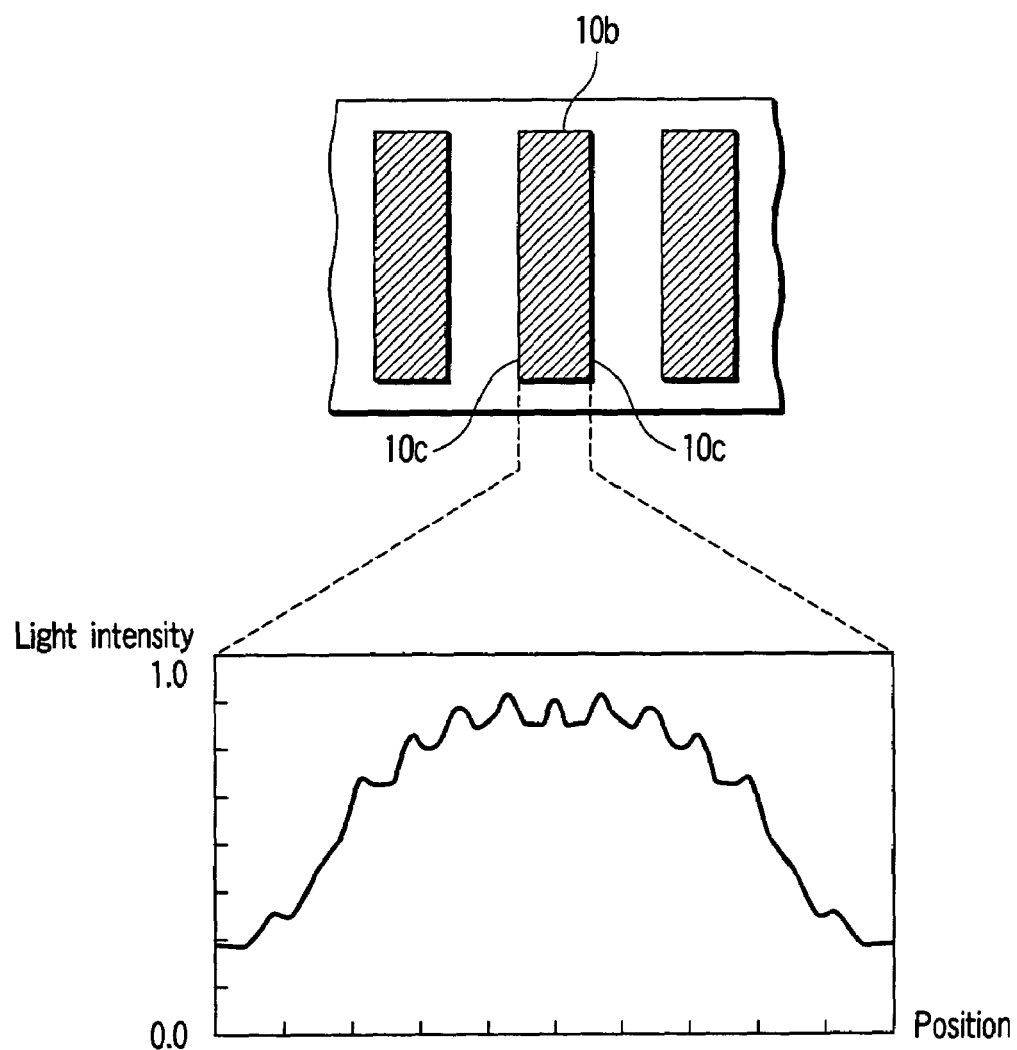
F I G. 10

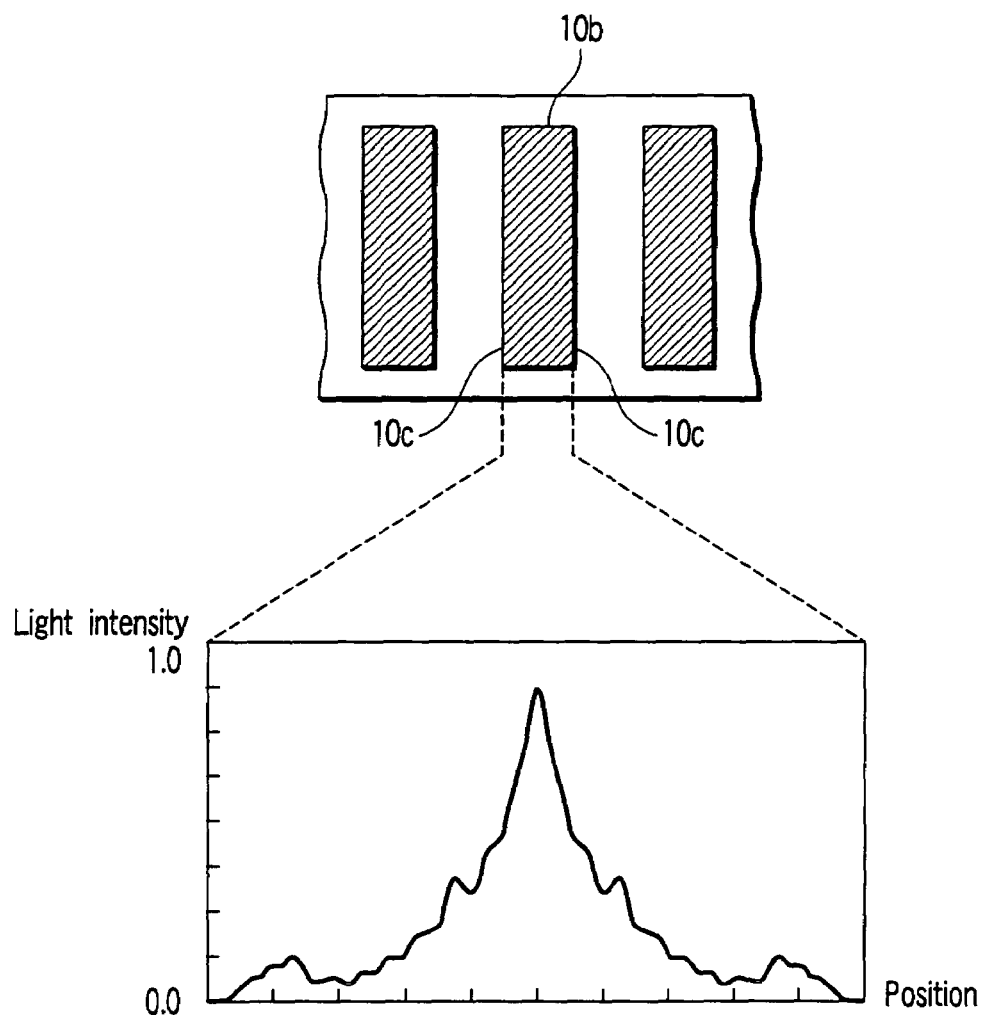
F I G. 11

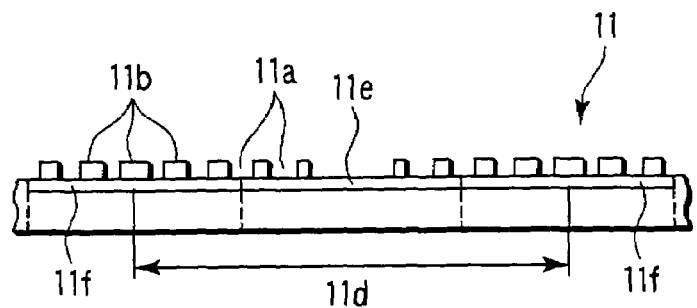
F I G. 13C
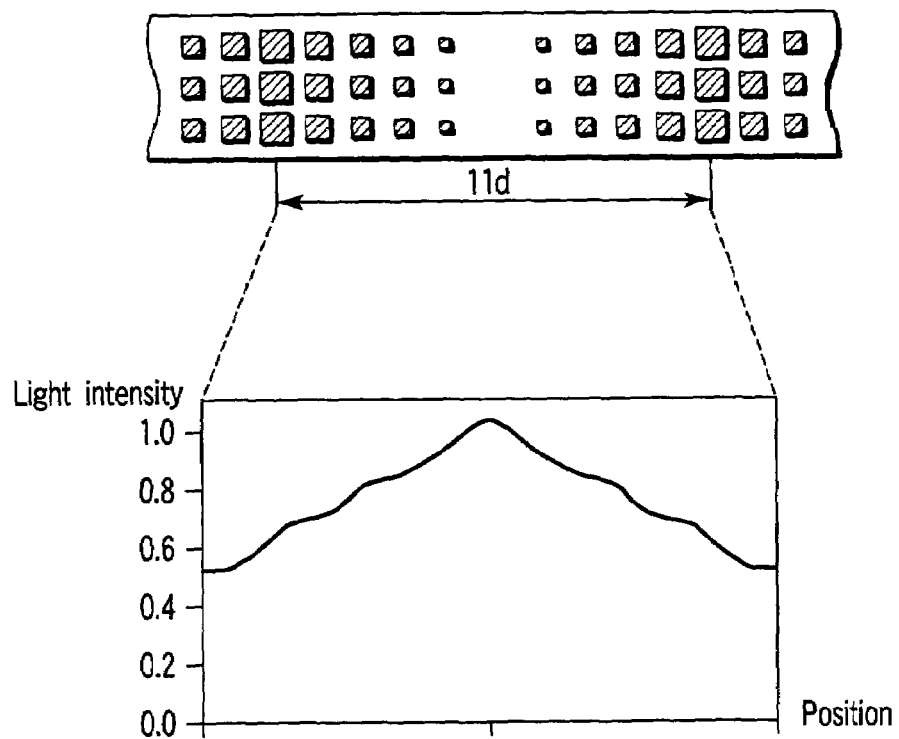
F I G. 14

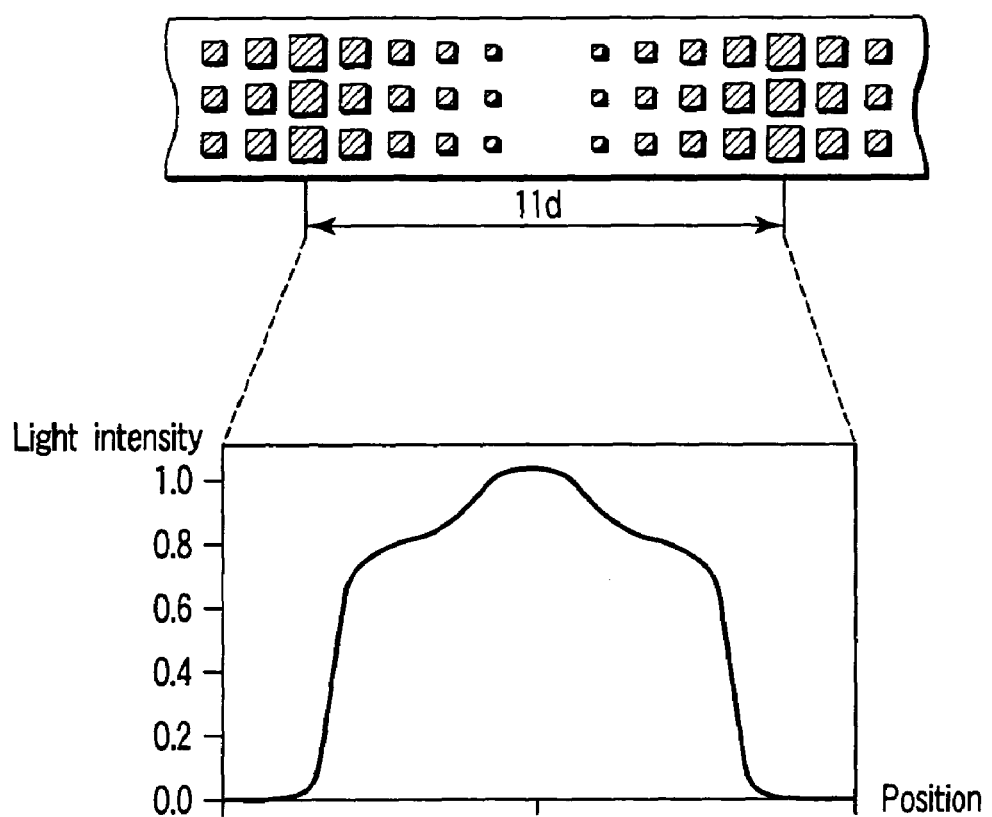
F I G. 15

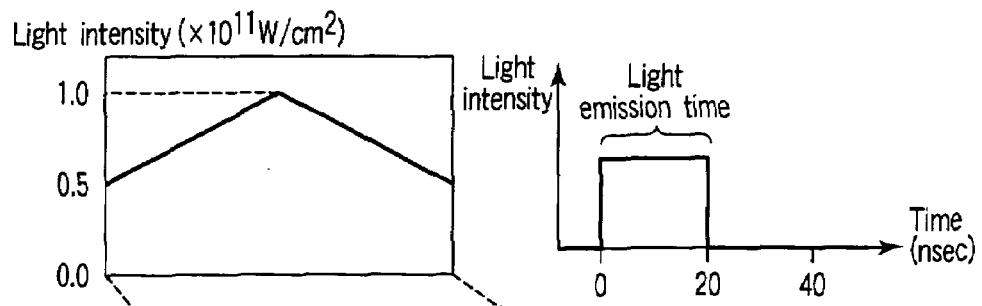
FIG. 18A PRIOR ART
FIG. 18B PRIOR ART
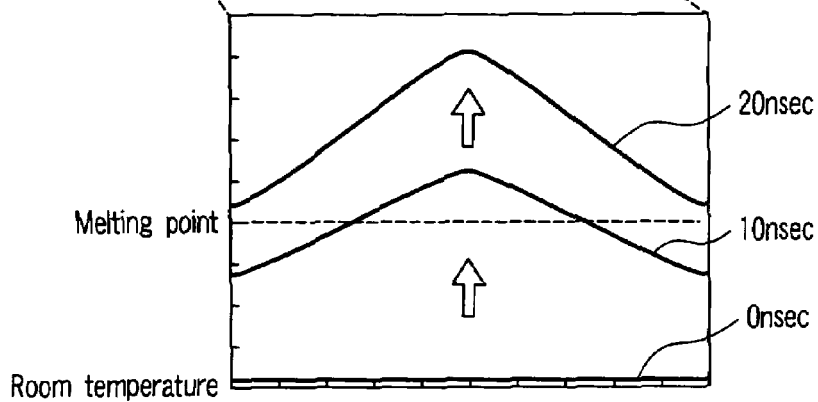
FIG. 18C PRIOR ART
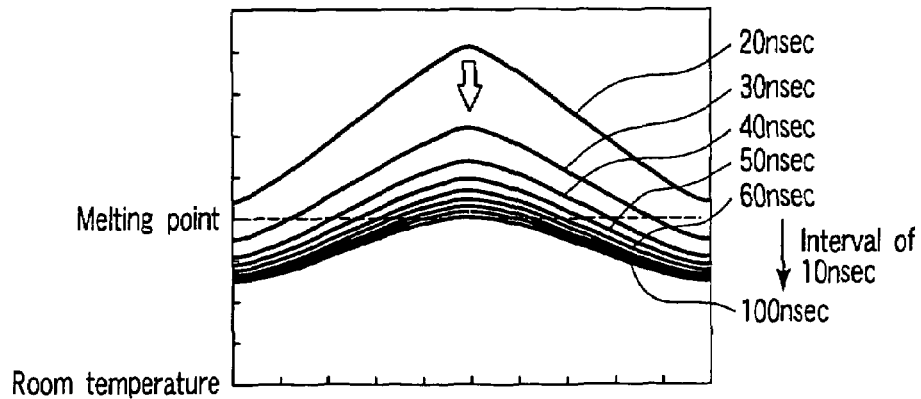
FIG. 18D PRIOR ART

CRYSTALLIZATION APPARATUS, CRYSTALLIZATION METHOD, DEVICE, OPTICAL MODULATION ELEMENT, AND DISPLAY APPARATUS

CROSS-REFERENCE TO RELATED APPLICATIONS

This application is based upon and claims the benefit of priority from prior Japanese Patent Application No. 2004-103373, filed Mar. 31, 2004, the entire contents of which are incorporated herein by reference.

BACKGROUND OF THE INVENTION

1. Field of the Invention

The present invention relates to a crystallization apparatus, a crystallization method, a device and an optical modulation element, and more particularly to a technique which generates a crystallized semiconductor film by irradiating a non-single-crystal substance such as a non-single-crystal semiconductor film with a laser light having a predetermined light intensity distribution.

2. Description of the Related Art

A thin film transistor (TFT) used for a switching element or the like which selects a display pixel in, e.g., a liquid crystal display (LCD) has been conventionally formed by using amorphous silicon or polysilicon.

Polysilicon has a higher mobility of electrons or holes than that of amorphous silicon. Therefore, when a transistor is formed by using polysilicon, a switching speed and hence a display response speed become higher than those in case of forming the same by using amorphous silicon. Further, a peripheral LSI can comprise a thin film transistor. Furthermore, there is an advantage of reducing a design margin of any other component. Moreover, when peripheral circuits such as a driver circuit or a DAC are incorporated in a display, these peripheral circuits can be operated at a higher speed.

Since polysilicon comprises an aggregation of crystal grains, when, e.g., a TFT transistor is formed in this polysilicon, crystal grain boundaries present in a channel region, this crystal grain boundary serves as a barrier, and a mobility of electrons or holes is reduced as compared with that of single-crystal silicon. Additionally, each of many thin film transistors formed by using polysilicon has a different number of crystal grain boundaries formed in a channel region, and this difference becomes irregularities, resulting in a problem of unevenness in display in case of a liquid crystal display. Thus, there has been recently proposed a crystallization method which generates crystallized silicon having a crystal grain with a large particle size enabling at least one channel region to be formed in order to improve the mobility of electrons or holes and reduce irregularities in number of crystal grain boundaries in a channel portion.

As this type of crystallization method, there has been conventionally known a "phase control ELA (Excimer Laser Annealing) method" which generates a crystallized semiconductor film by irradiating a phase shifter approximated in parallel with a polycrystal semiconductor film or a non-single-crystal semiconductor film with an excimer laser light. The detail of the phase control ELA method is disclosed in, e.g., Journal of The Surface Science Society of Japan, Vol. 21, No. 5, pp. 278-287, 2000.

In the phase control ELA method, a light intensity distribution having an inverse peak pattern (a pattern in which a light intensity is minimum at the center and the light intensity is suddenly increased toward the periphery (lateral sides)) in which a light intensity at a point corresponding to a phase shift portion of a phase shifter is lower than that in the periphery is generated, and a non-single-crystal semiconductor film (a polycrystal semiconductor film or an amorphous semiconductor film) is irradiated with a light having this light intensity distribution with an inverse peak shape. As a result, a temperature gradient is generated in a fusion area in accordance with a light intensity distribution in an irradiation target area, a crystal nucleus is formed at a part which is solidified first or a part which is not molten in accordance with a point where the light intensity is minimum, and a crystal grows from the crystal nucleus in a lateral direction toward the periphery (which will be referred to as a "lateral growth" or a "growth in the lateral direction" hereinafter), thereby generating a single-crystal grain with a large particle size.

Further, "Growth of Large Si Grains at Room Temperature by Phase-Modulated Excimer-Laser Annealing Method" by H. Ogawa et al., IDW' 03 Proceedings of the 10th International Display Workshops, p. 323 releases a crystallization method which generates a crystal grain by irradiating a non-single-crystal semiconductor film with a light having a V-shaped light intensity distribution which can be obtained through a phase shifter and an image formation optical system. Furthermore, this known reference discloses that it is desirable for an intensity distribution of a light with which the non-single-crystal semiconductor film is irradiated to vary in a V-shape in an intensity range of 0.5 to 1.0 when the maximum value of the intensity is standardized as 1.0.

In the crystallization method disclosed in this known reference, a pulse oscillation type laser light source like an excimer laser light source is used, and each typical pulse light emission time thereof is 20 to 30 nsec (nanoseconds). This time is set in order to obtain a large light intensity required to melt a semiconductor by concentrating an light emission energy on a part of the semiconductor like silicon in a very short time. As a result, a semiconductor can be irradiated with the same light intensity distribution (V-shaped) for each pulse light emission time.

Disadvantages caused due to irradiating a semiconductor with the same V-shaped light intensity distribution in the prior art disclosed in the last known reference will now be described hereinafter with reference to FIGS. 18A to 18D (FIGS. 18C and 18D are views showing calculation results concerning a change in temperature distribution in an a-Si (noncrystalline silicon or amorphous silicon) layer obtained when the a-Si layer is irradiated with a light beam having a V-shaped light intensity distribution over a fixed time in accordance with the prior art). On the occasion of calculating this temperature distribution, a calculation method described in "A New Nucleation-Site-Control Excimer-Laser-Crystallization Method" by Mitsuru Nakata et al., Jpn. J. Apple. Phys. Vol. 40 (2001) Pt. 1, No. 5A, 3049p is adopted, and this cited reference is incorporated herein as a reference. Moreover, on the occasion of calculating a temperature distribution, an influence of latent heat which is absorbed/generated when a-Si is molten/solidified is ignored. As calculation conditions, there is assumed a layer structure comprising an $SiO_2$ layer having a thickness of 200 nm, an a-Si layer having a thickness of 200 nm, and an $SiO_2$ layer having an infinite thickness in the order from a light incidence side. It is assumed that a maximum light intensity is $1.0 \times 10^{11}$ W/cm$^2$ in a unit light intensity distribution having a V-shape shown in FIG. 18A (which indicates one mountain-shape unit intensity portion in a light intensity distribution comprising a plurality of V-shaped unit light intensity distributions which are continuously formed in the drawing), and each pulse light emission time is 20 nsec as shown in FIG. 18B. Additionally, it is assumed that a-Si has a thermal conductivity of 24 W/mK, specific heat of 861 J/KKg and a density of 2340 Kg/m$^3$. Further, it is assumed that $SiO_2$ has a heat conductivity of 1.5 W/mK, specific heat of 1000 J/KKg and a density of 2300 Kg/m$^3$.

Referring to FIG. 18C showing a change in temperature distribution during pulse light emission, it can be understood that the temperature distribution keeps the V-shape (which indicates a chevron part in the continuously formed V-shaped light intensity distribution in the drawing) and achieves an increase in temperature with an elapse of time in 20 nsec during which a light beam having a V-shaped light intensity distribution is applied. However, referring to FIG. 18D showing a change in temperature distribution after pulse light emission, it can be recognized that a temperature is gradually reduced with an elapse of time after end of pulse light emission and a temperature gradient in a high-temperature region (a peak portion) in the V-shaped temperature distribution is flattened with a time. A factor of this phenomenon is thermal diffusion in an in-plane direction in the a-Si layer.

FIG. 19 is a view schematically showing an advancing state of crystallization of a-Si involved by a change in temperature distribution depicted in FIG. 18C. In crystallization of Si involved by a change in temperature distribution depicted in FIG. 18C, as shown in FIG. 19, after an entire light reception region of a-Si is once molten and incidence of a laser light is interrupted, partial crystallization occurs at a part where a temperature is lowest, i.e., a bottom part of the V-shaped temperature distribution (and hence a light intensity distribution). Thereafter, a crystal grows in the lateral direction with this crystallized part serving as a nucleus due to heat of a temperature gradient in the V-shaped temperature distribution. However, when the crystal growth is in the final stage and a high-temperature region (in the vicinity of a peak) of the V-shaped temperature distribution (and hence the light intensity distribution) is reached, the temperature gradient in the high-temperature region is in a flat state (a state in which the temperature distribution is rounded) due to an advance of thermal diffusion.

Therefore, the primarily desired crystal growth is terminated before reaching the high-temperature region, an undesired crystal nucleus is generated in the high-temperature region in the V-shaped temperature distribution, and this high-temperature region is polycrystallized. As a result, the influence of thermal diffusion in the final stage of the crystal growth disables realization of the sufficient crystal growth from the crystal nucleus and hence generation of a crystallized semiconductor having a crystal grain with a large particle size. In this case, the "crystal grain with a large particle size" means a crystal grain having a size with which a channel region of one TFT can be completely formed in the crystal grain. Further, in this case, a margin of a positioning accuracy is narrowed, for example.

Although the influence of latent heat is not considered in the above-described calculation, a temperature increases in the vicinity of a solid-liquid interface due to latent heat generated during solidification. This phenomenon is introduced in "formation of an Si thin film with a huge crystal grain using an excimer laser" by Masakiyo Matsumura, Journal of The Surface Science Society of Japan, Vol. 21, No. 5, pp. 278, 2000. Analogizing from a result introduced in this reference, it can be conjectured that a temperature distribution is affected by latent heat and is as shown in FIG. 20 when a temperature gradient in a high-temperature region is flattened in FIG. 19. In this case, it can be considered that flattening of the temperature gradient due to the influence of emission of latent heat further widely occurs and the crystal growth from the crystal nucleus from which crystallization has first started becomes shorter (a crystal grain which is short in the lateral direction is obtained).

BRIEF SUMMARY OF THE INVENTION

It is an object of the present invention to provide a crystallization apparatus, a crystallization method, a device, an optical modulation element and a display apparatus which can realize the sufficient crystal growth from a crystal nucleus and thereby generate a crystallized substance with a large particle size while suppressing an influence of thermal diffusion or emission of latent heat in the final stage of the crystal growth.

A first aspect of the present invention provides a crystallization apparatus comprising:

a first optical modulation element which irradiates a non-single-crystal substance with a light beam which is to have a first light intensity distribution on the non-single crystal substance by modulating an intensity of an incident first light beam, thereby melting the non-single-crystal substance;

a second optical modulation element which irradiates the non-single-crystal substance with a light beam which is to have a second light intensity distribution substantially different from the first light intensity distribution on the non-single-crystal substance by modulating an intensity of an incident second light beam, thereby melting the non-single-crystal substance; and an illumination system which causes the light beam having the second light intensity distribution to enter the molten part of the non-single-crystal substance in a period that the non-single-crystal substance is partially molten by irradiation of the light beam having the first light intensity distribution.

A second aspect of the present invention provides a crystallization apparatus comprising:

a first optical modulation element which irradiates a non-single-crystal substance with a first light beam which is to have on the non-single-crystal substance a light intensity distribution having at least two V-shaped unit intensity distributions which are adjacent to define a chevron unit light intensity distribution therebetween by modulating an intensity of the incident first light beam, thereby melting the non-single-crystal substance;

a second optical modulation element which irradiates the non-single-crystal substance with a second light beam which is to have a second light intensity distribution on the non-single-crystal substance by modulating an intensity of the incident second light beam, thereby melting the non-single-crystal substance; and an illumination system which irradiates a part of the non-single-crystal molten by the first light beam with the second light beam after an elapse of a predetermined time from start of irradiation of the first light beam.

In the first and second aspects, the illumination system can have a light source which supplies an illumination light beam, a beam splitter which divides a light beam supplied from the light source, a first optical system which leads one light beam from the beam splitter to the first optical modulation element, and a second optical system which has a longer optical path length than the first optical system and leads the other light beam from the beam splitter to the second optical modulation element.

Further, in these aspects, preferably, the first optical modulation element and the second optical modulation element are a common optical modulation element, and the illumination system causes the first light beam having a first angular distribution to enter the common optical modulation element and then causes the second light beam having a second angular distribution substantially different from the first angular distribution to enter the common optical modulation element. In this case, the illumination system preferably has a light source which supplies an illumination light beam, a beam splitter which divides a light beam supplied from the light source, a first shaping optical system which shapes one light beam from the beam splitter and leads this light beam to a predetermined position, a second shaping optical system which has a longer optical path length than the first shaping optical system, shapes the other light beam from the beam splitter and leads this light beam to the predetermined position, an optical path combining element which is arranged at the predetermined position and combines an optical path of the light beam transmitted through the first shaping optical system and an optical path of the light beam transmitted through the second shaping optical system, and a common illumination optical system arranged between the optical path combining element and the common optical modulation element.

Furthermore, in these aspects, preferably, the first optical modulation element and the second optical modulation element are a common optical modulation element, and the illumination system causes the first light beam having a first polarization state to enter the common optical modulation element and then causes the second light beam having a second polarization state substantially different from the first polarization state to enter the common optical modulation element. In this case, the illumination system preferably has a light source which supplies an illumination light beam, a polarizing beam splitter which divides a light beam supplied from the light source, a first optical system which leads a light beam of S polarization reflected by the beam splitter to a predetermined position, a second optical system which has a longer optical path length than the first optical system and leads a light beam of P polarization transmitted through the beam splitter to the predetermined position, an optical path combining element which is arranged at the predetermined position and combines an optical path of the light beam of S polarization transmitted through the first optical system with an optical path of the light beam of P polarization transmitted through the second optical system, and a common illumination optical system arranged between the optical path combining element and the optical modulation element. Furthermore, in this case, it is preferable for the common optical modulation element to include a pattern area in which a transmission factor for the first light beam having the first polarization state is substantially different from a transmission factor for the second light beam having the second polarization state.

Moreover, in these aspects, preferably, there is further provided a common image formation optical system arranged between the first and second optical modulation elements and the non-single-crystal semiconductor.

A third aspect of the present invention provides a crystallization method which generates a crystallized substance by irradiating a non-single-crystal substance with a light beam having a predetermined light intensity distribution, comprising:

a first irradiation step of irradiating the non-single-crystal substance with a first light beam having a first light intensity distribution; and a second irradiation step of irradiating a molten part of the non-single-crystal substance with a light beam having a second light intensity distribution substantially different from the first light intensity distribution within a time in which the non-single-crystal substance is molten by the first irradiation step.

A fourth aspect of the present invention provides a crystallization method which generates a crystallized substance by irradiating a non-single-crystal substance with a light beam having a predetermined light intensity distribution, comprising:

irradiating firstly the non-single-crystal substance with a first light beam which is to have on the non-single-crystal substance a light intensity distribution having at least two V-shaped unit intensity distributions which are adjacent to define a chevron unit light intensity distribution therebetween; and irradiating secondly a high-temperature region formed to the non-single-crystal substance in accordance with an apex of the chevron unit light intensity distribution with a light beam having a second light intensity distribution after an elapse of a predetermined time from start of the first irradiation step in order to compensate flattening of a temperature gradient with time in the high-temperature region of the non-single-crystal substance.

In the third and fourth aspects, preferably, the non-single-crystal semiconductor is irradiated with a light beam subjected to phase modulation through the first optical modulation element in the first irradiation step, and the non-single-crystal semiconductor is irradiated with a light beam subjected to phase modulation through the second optical modulation element having different characteristics from those of the first optical modulation element. Alternatively, it is preferable that the first light beam is caused to enter the common optical modulation element and the non-single-crystal semiconductor is irradiated with the light beam subjected to phase modulation through the common optical modulation element in the first irradiation step, and that the second light beam having characteristics different from those of the first light beam is caused to enter the common optical modulation element and the non-single-crystal semiconductor is irradiated with the light beam subjected to phase modulation through the common optical element.

According to a fifth aspect of the present invention, there is provided a device manufactured by using the crystallization apparatus of the first or second aspect or the crystallization method of the third or fourth aspect.

According to a sixth aspect of the present invention, there is provided an optical modulation element including a pattern area in which a transmission factor differs depending on a polarization state of an incident light beam, and a phase modulation area.

According to a seventh aspect of the present invention, there is provided a crystallization apparatus comprising:

an optical modulation element which forms on a non-single-crystal substance a first light beam having a first light intensity distribution obtained by modulating a phase of the incident first light beam; and an illumination system which causes a second light beam having a second light intensity distribution having the same peak position as a peak position of the first light intensity distribution to enter a portion of the non-single-crystal substance irradiated with the light beam having the first light intensity distribution within a period in which the non-single-crystal substance irradiated with the first light beam through the optical modulation element is partially fused.

In the seventh aspect, a minimum value to a maximum value of the light beam having the first light intensity distribution may have a light intensity which is not less than a fusing point of the non-single-crystal substance, and a light beam of at least a maximum value portion in the light beam having the second light intensity distribution may form on the non-single-crystal substance a light intensity which is not less than the fusing point of the non-single-crystal substance.

A channel area may be formed by using the crystallization apparatus and/or the crystallization method as described above.

It should be noted that the in the present specification, term "non-single-crystal" is used to mean non-single-crystal in molten state, too, for descriptive purpose.

With the technique according to the above-described aspects, it is possible to compensate flattening of a temperature gradient with time in, e.g., a high-temperature region of a V-shaped temperature distribution against an influence of thermal diffusion or emission of latent heat, and assuredly maintain a necessary temperature gradient in the high-temperature region even in the final stage of crystal growth. As a result, the sufficient crystal growth from a crystal nucleus can be realized and a crystal grain with a large particle size can be generated while suppressing the influence of thermal diffusion or emission of latent heat in the final stage of the crystal growth.

BRIEF DESCRIPTION OF THE SEVERAL VIEWS OF THE DRAWING

FIGS. 5A and 5B are views schematically showing pulse light emission characteristics of a light source in the first embodiment and a temporal relationship between a first pulse light which enters the first optical modulation element and a second pulse light which enters the second optical modulation element, respectively;

FIGS. 9A and 9B are views schematically showing a positional relationship between a common optical modulation element and a processed substrate in the second embodiment and a phase pattern of the common optical modulation element, respectively;

FIG. 10 is a view schematically showing a light intensity distribution formed on the processed substrate when a first pulse light is caused to enter the common optical modulation element in the second embodiment;

FIG. 11 is a view schematically showing a light intensity distribution formed on the processed substrate when a second pulse light is caused to enter the common optical modulation element in the second embodiment;

FIGS. 13A, 13B and 13C are views schematically showing a phase pattern of a common optical modulation element in the third embodiment, an electroconductive film pattern, and the common optical modulation element, respectively;

FIG. 14 is a view schematically showing a light intensity distribution formed on a processed substrate when a first pulse light is caused to enter the common optical modulation element in the third embodiment;

FIG. 15 is a view schematically showing a light intensity distribution formed on the processed substrate when a second pulse light is caused to enter the common optical modulation element in the third embodiment;

FIGS. 18A to 18D are views illustrating a calculation result concerning a change in temperature distribution obtained when a-Si is irradiated with a light beam having a V-shaped light intensity distribution over a fixed time in accordance with a prior art;

DETAILED DESCRIPTION OF THE INVENTION

Embodiments according to the present invention will now be described hereinafter with reference to the accompanying drawings.

Figure 1:
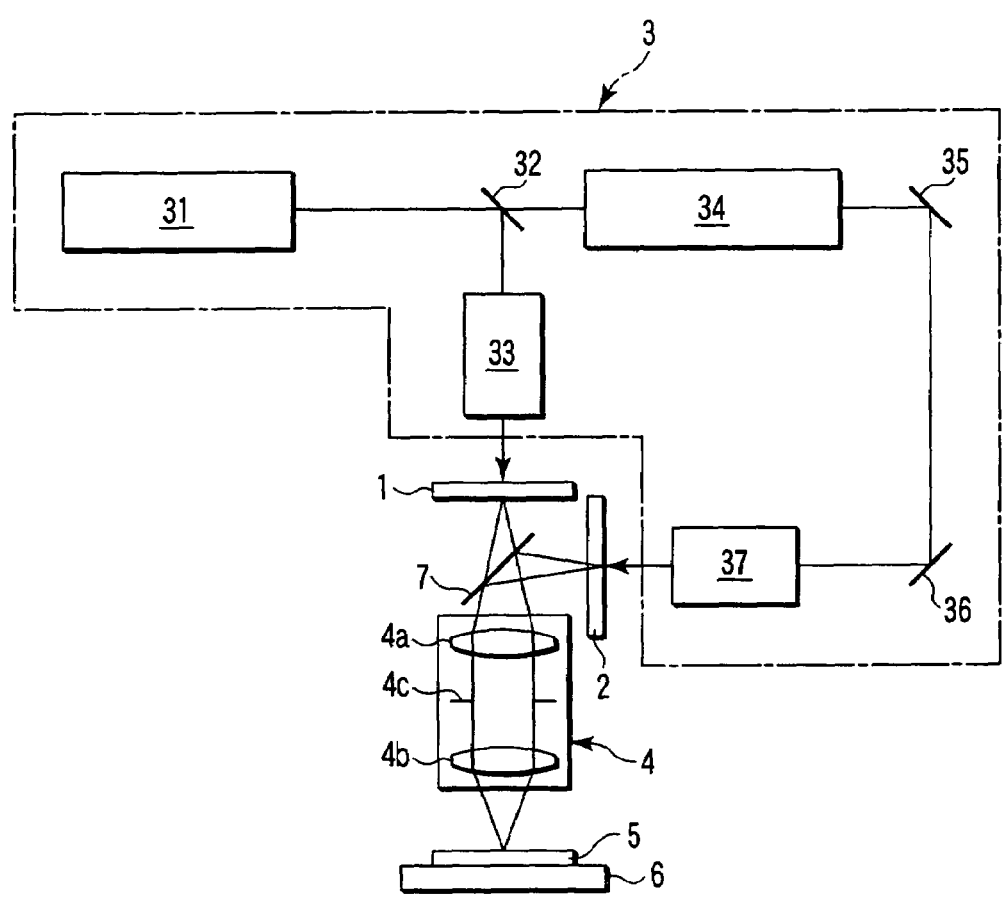
FIG. 1 is a view schematically showing a structure of a crystallization apparatus according to a first embodiment of the present invention.
Figure 2:
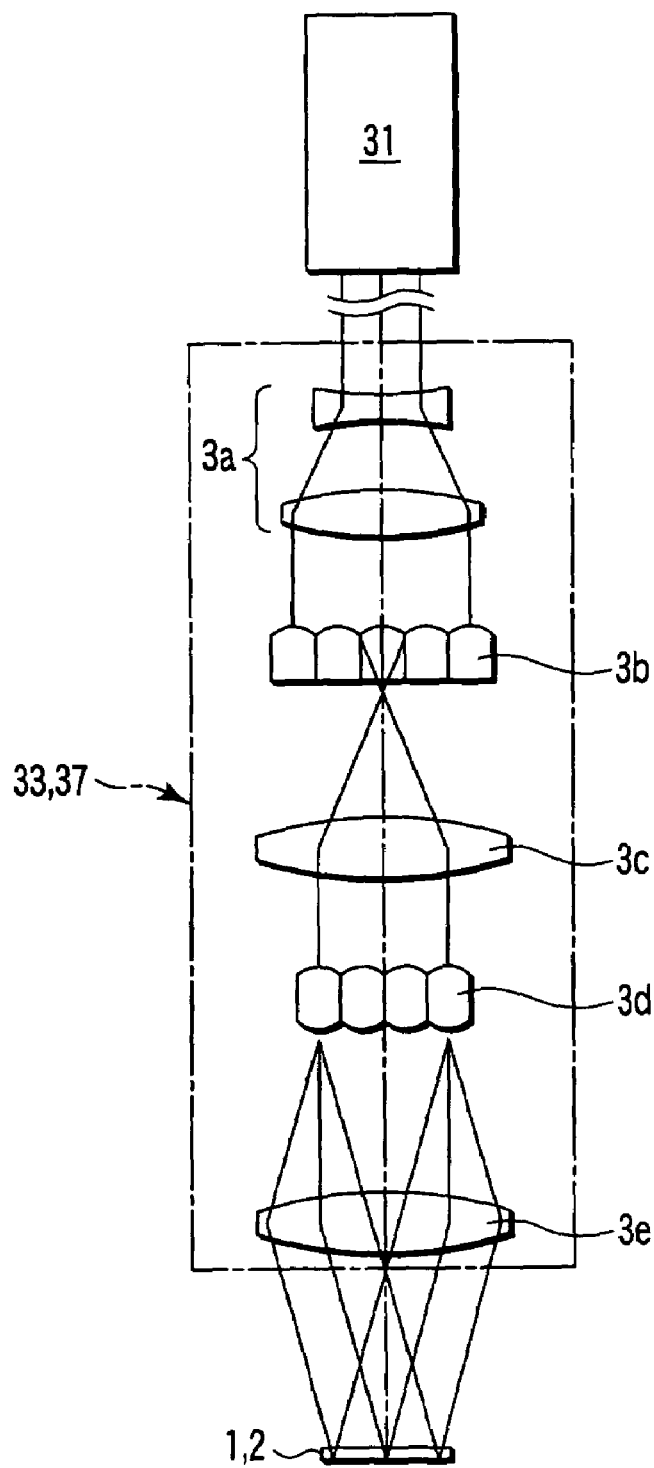
FIG. 2 is a view schematically showing internal structures of a first illumination optical system and a second illumination optical system depicted in FIG. 1.

FIG. 1 is a view schematically showing a structure of a crystallization apparatus according to a first embodiment of the present invention. FIG. 2 is a view schematically showing internal structures of a first illumination optical system and a second illumination optical system.

Referring to FIG. 1, the crystallization apparatus according to the first embodiment comprises a first optical modulation element 1 and a second optical modulation element 2 each of which modulates a phase of an incident light beam, an illumination system 3, an image formation optical system 4, and a substrate stage 6 on which a processed substrate 5 is mounted.

The detailed structures and effects of the first optical modulation element 1 and the second optical modulation element 2 will be described later. The illumination system 3 includes a KrF excimer laser light source 31 which supplies a pulse laser light having a wavelength of, e.g., 248 nm as a light source which outputs an energy light which melts a non-single-crystal semiconductor of the processed substrate 5. As the light source 31, it is also possible to use any other appropriate light source such as an XeCl excimer laser light source or a YAG laser light source which has a performance of emitting an energy light ray which melts a crystallization processing target or a non-single-crystal semiconductor. A laser light emitted from the light source 32 enters a beam splitter 32 by which the laser light is divided into two portions.

One part of the laser light reflected by the beam splitter 32 (a first laser light) is led to the first optical modulation element 1 through a first illumination optical system 33. The other part of the laser light transmitted through the beam splitter 32 (a second laser light) is led to the second optical modulation element 2 through a delay optical system 34 which includes, e.g., a plurality of reflection members and has a relatively long optical path, a pair of mirrors 35 and 36, and a second illumination optical system 37 having the same configuration as the first illumination optical system 33. Therefore, an optical path length from the beam splitter 32 to the second optical modulation element 2 is set to be longer than an optical path length from the beam splitter 32 to the first optical modulation element 1 by a predetermined distance. This predetermined distance is a distance corresponding to a timing with which irradiation is performed through the second optical modulation element 2 in a period that the non-single-crystal semiconductor of the processed substrate 5 irradiated through the first optical modulation element 1 is partially molten. Partial fusion of the non-single-crystal semiconductor means a period in which at least a maximum value of a light intensity distribution is molten in a temperature drop process of the non-single-crystal semiconductor irradiated through the first optical modulation element 1 in a pulse-like manner.

The light beam which has been emitted from the light source 31 and entered the first illumination optical system 33 (or the second illumination optical system 37) is expanded through a beam expander 3a and then enters a first fly-eye lens 3b as shown in FIG. 2. In this manner, a plurality of small light sources are formed on a rear focal surface of the first fly-eye lens 3b, and light fluxes from the plurality of small light sources illuminate an incidence surface of a second fly-eye lens 3d in an overlapping manner. As a result, more small light sources than those on the rear focal surface of the first fly-eye lens 3b are formed on a rear focal surface of the second fly-eye lens 3d.

Light fluxes from the plurality of small light sources formed on the rear focal surface of the second fly-eye lens 3d illuminate the first optical modulation element 1 (or the second optical modulation element 2) through a second condenser optical system 3e in an overlapping manner. Here, the first fly-eye lens 3b and the first condenser optical system 3c constitute a first homogenizer. The first homogenizer homogenizes the laser light supplied from the light source 31 in relation to an incidence angle on the first optical modulation element 1 (or the second optical modulation element 2).

The second fly-eye lens 3d and the second condenser optical system 3e constitute a second homogenizer. The second homogenizer homogenizes the laser light having the incidence angle homogenized by the first homogenizer in relation to a light intensity at each in-plane position on the first optical modulation element 1 (or the second optical modulation element 2). In this manner, the illumination system 3 illuminates each of the first optical modulation element 1 and the second optical modulation element 2 with the laser light having the substantially homogeneous light intensity distribution. In the above explanation, it can be understood that the illumination system 3 causes a first pulse light having a predetermined light emission time to enter the first optical modulation element 1, and then causes a second pulse light having the same light emission time as the first pulse light to enter the second optical modulation element 2 after a predetermined time (corresponding to the predetermined distance) from start of incidence of the first pulse light to the first optical modulation element 1. The predetermined distance is a distance corresponding to a timing with which irradiation is performed through the second optical modulation element 2 in a period that the non-single-crystal semiconductor of the processed substrate 5 irradiated through the first optical modulation element 1 is partially molten.

The first laser light subjected to phase modulation by the first optical modulation element 1 is transmitted through the beam splitter 7 and then enters the processed substrate 5 through the image formation optical system 4. On the other hand, the second laser light subjected to phase modulation by the second optical modulation element 2 is reflected by the beam splitter 7 and then enters the processed substrate 5 through the image formation optical system 4. Here, in the image formation optical system 4, pattern surfaces of the first optical modulation element 1 and the second optical modulation element 2 and the processed substrate 5 (which is precisely an upper surface of the non-single-crystal semiconductor layer) are arranged in an optically conjugate relationship. In other words, the processed substrate 5 is set to a surface (an image surface of the image formation optical system 4) which is optically conjugate with the pattern surfaces of the first optical modulation element 1 and the second optical modulation element 2).

The image formation optical system 4 includes an aperture diaphragm assembly 4c between a front positive lens assembly 4a and a rear positive lens assembly 4b. The aperture diaphragm assembly 4c comprises a plurality of aperture diaphragms having aperture portions (light transmission portions) of different sizes. In practice, one selected diaphragm is used. Thus, the plurality of aperture diaphragms 4c may be replaceable with respect to an optical path. Alternatively, as the aperture diaphragm 4c, it is possible to use an iris diaphragm which can continuously change a size of an aperture portion. In any case, a size of an aperture portion of the aperture diaphragm 4c (and hence an image side numerical aperture NA of the image formation optical system 4) is set so that a necessary light intensity distribution can be generated on the semiconductor layer of the processed substrate 5 as will be described later. This image formation optical system 4 may be a refraction type optical system, a reflection type optical system, or a refraction/reflection type optical system.

The processed substrate 5 is crystallized in a process where an image of the first laser light subjected to phase modulation by the first optical modulation element 1 is formed and fusion and solidification are carried out. The processed substrate 5 is obtained, for example, by sequentially forming an underlying film, an amorphous silicon film (a semiconductor layer) and a cap film on, e.g., a liquid crystal display glass sheet substrate by chemical vapor deposition (CVD). The underlying insulating film is formed of an insulating material, e.g., $SiO_2$, and avoids mixing of a foreign particle such as Na in the glass substrate into the amorphous silicon film which occurs when the amorphous silicon film is directly brought into contact with the glass substrate, and prevents a melting temperature of the amorphous silicon film from being directly transmitted to the glass substrate. The amorphous silicon film is a semiconductor film to be crystallized, and this is a non-single-crystal film, an amorphous semiconductor film or a polycrystal semiconductor.

The non-single-crystal film is not restricted to the semiconductor film, and it may be a film formed of a non-single-crystal material such as a non-single-crystal metal. An insulating film, e.g., an $SiO_2$ film is preferably formed as the cap film on the amorphous silicon film. The cap film is heated by a part of a light beam which enters the amorphous silicon film, and stores a temperature when heated. Although a temperature in a high-temperature portion is relatively rapidly reduced on an irradiation target surface of the amorphous silicon film when incidence of a light beam is interrupted if no cap film is provided, the thermal storage effect alleviates this temperature drop gradient and facilitates the lateral crystal growth with a large particle size. The processed substrate 5 is positioned and held at a predetermined position on the substrate stage 6 by a vacuum chuck or an electrostatic chuck.

Figure 3A:
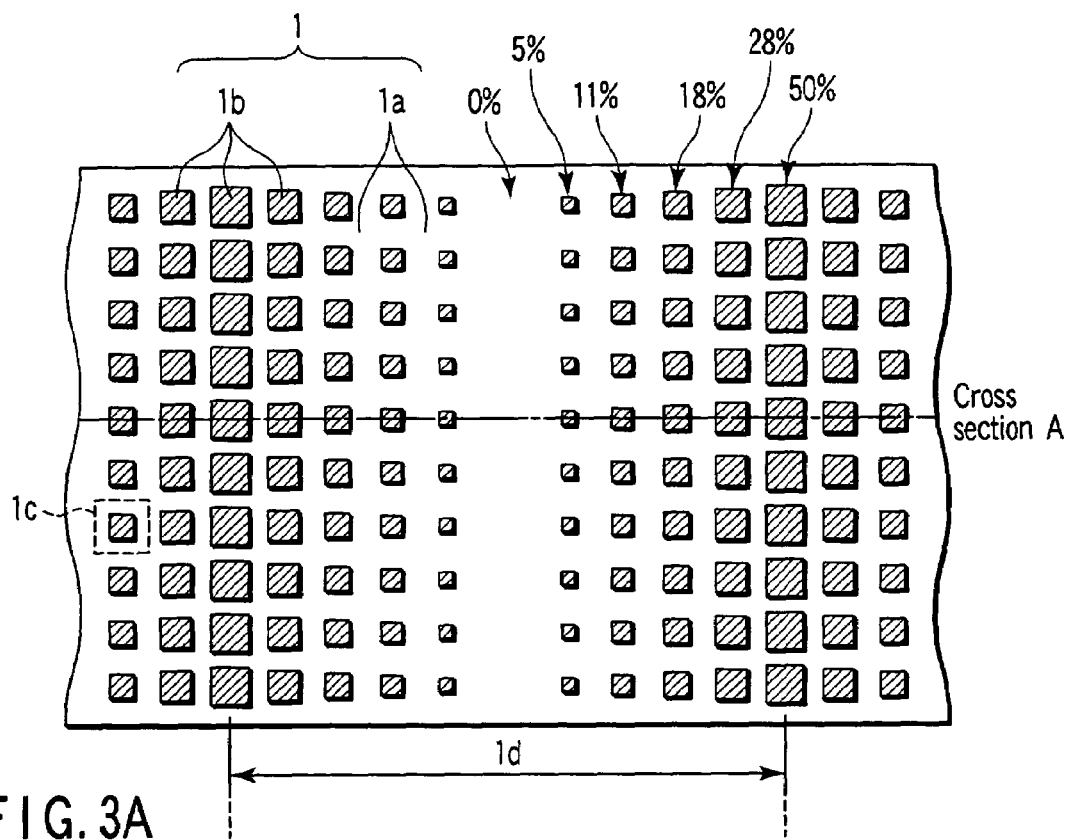
FIGS. 3A and 3B are views schematically showing a phase pattern of a first optical modulation element in the first embodiment and a light intensity distribution formed on a processed substrate by using the first optical modulation element, respectively.
Figure 3B:
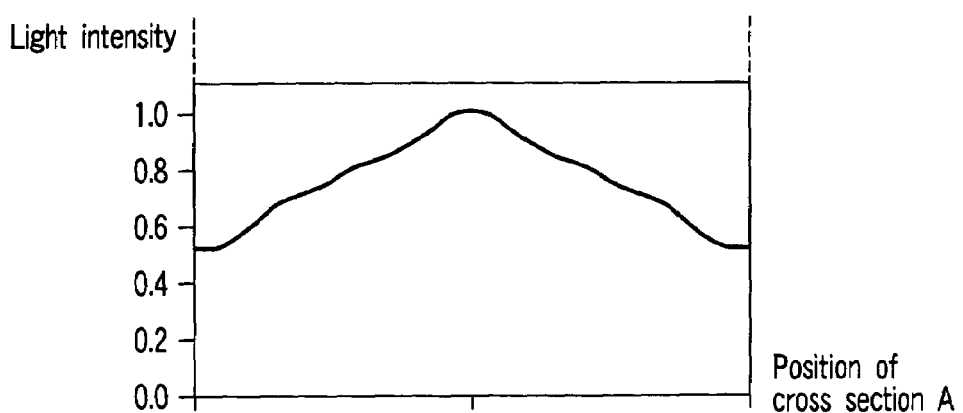

FIG. 3A is a view schematically showing a phase pattern of the first optical modulation element 1 in the first embodiment, and FIG. 3B is a view schematically showing a light intensity distribution of the first laser light formed on the processed substrate by using the first optical modulation element. As shown in FIG. 3A, the first optical modulation element 1 in the first embodiment has a reference phase area (indicated by a blank portion in the figure) 1a having a reference phase value of 0 degree, and each rectangular (square in this embodiment) modulation phase area (indicated by a shaded portion in the drawing) 1b having a modulation phase value of 90 degrees in a cycle in the lateral direction (a direction parallel to a cross section A). Here, the modulation phase areas 1b are arranged in a matrix form in the vertical and horizontal directions in accordance with a pitch of 1.0 μm (a reduced value on the image surface of the image formation optical system 4, and a dimension concerning the optical modulation element is indicated by an image surface reduced value and so forth).

Further, an area share ratio (a duty) 1c of the modulation phase area 1b with respect to a unit cell (an area surrounded by a dotted line) of 1.0 μm×1.0 μm including one phase area varies between 0% and 50% in the lateral direction (along the cross section A). Specifically, an area share ratio of the modulation phase area 1b on the both sides of a repeated unit area 1d of the phase pattern is 50% (a maximum area share ratio), whilst an area share ratio of the modulation phase area 1b at the center of the repeated unit area 1d is 0% (a minimum area share ratio), and the area share ratio of the modulation phase area 1b between these ratios varies in the order of 28%, 18%, 11% and 5%. The unit cell 1c of 1.0 μm×1.0 μm has a dimension which is not more than a point spread function range of the image formation optical system 4.

When the first optical modulation element 1 according to the first embodiment is used, as shown in FIG. 3B, a mountain-shape unit light intensity distribution (a light intensity distribution between minimum peak value portions of adjacent V-shaped unit light intensities) is formed on the surface of the processed substrate 5 set at the image surface position of the image formation optical system 4 in accordance with the unit area 1d. That is, there is formed a mountain-shape unit light intensity distribution in which a light intensity is minimum in accordance with a position of the cross section A where the area share ratio of the modulation phase area 1b is 50% and the light intensity is maximum in accordance with a position of the cross section A where the area share ratio of the modulation phase area 1b is 0%. Actually, the first optical modulation element 1 has a plurality of phase patterns shown in FIG. 3A aligned in the lateral direction. As a result, the plurality of chevron (i.e., V-shaped) unit light intensity distributions shown in FIG. 3B are formed in the lateral direction on the irradiation target surface, and the light intensity distribution on the irradiation surface is therefore defined as a plurality of V-shaped light intensity distributions. FIG. 3B shows one chevron or mountain-shape light intensity distribution corresponding to the repeated unit area 1d of the phase pattern in the plurality of V-shaped light intensity distributions continuously formed along the direction of the cross section A.

Figure 4A:
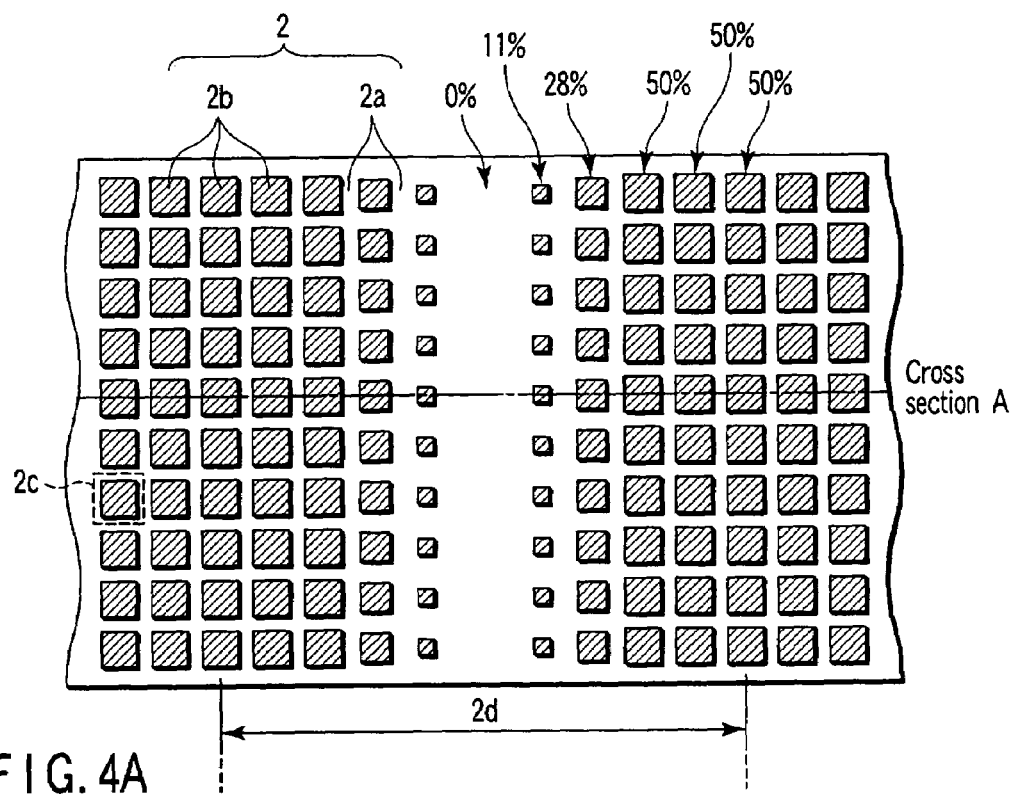
FIGS. 4A and 4B are views schematically showing a phase pattern of a second optical modulation element in the first embodiment and a light intensity distribution formed on the processed substrate by using the second optical modulation element, respectively.
Figure 4B:
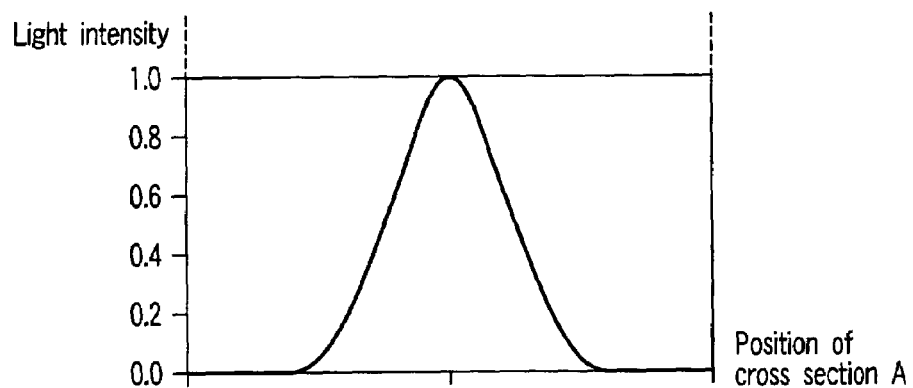

FIGS. 4A and 4B are views schematically showing a phase pattern of the second optical modulation element 2 in the first embodiment and a light intensity distribution formed on the processed substrate 5 by using the second optical modulation element 2, respectively. As shown in FIG. 4A, the second optical modulation element 2 according to the first embodiment has a reference phase area (indicated by a blank portion in the figure) 2a having a reference phase value of 0 degree and each rectangular (square in this embodiment) modulation phase area (indicated by a shaded portion in the figure) 2b having a modulation phase value of 180 degrees. Here, the modulation phase areas 2b are arranged in the vertical and horizontal directions in accordance with a pitch of 1.0 μm (an image surface reduced value).

An area share ratio (a duty) of the modulation phase area 2b with respect to a unit cell (a square area surrounded by a dotted line) 2c of 1.0 μm×1.0 μm including one phase area varies between 0% and 50% along the horizontal direction (along the cross section A) in the drawing. Specifically, an area share ratio of the modulation phase area 2b on the both sides of a repeated unit area 2d of the phase pattern is 50%, whilst an area share ratio of the modulation phase area 2b at the center of the repeated unit area 2d is 0%, and an area share ratio of the modulation phase area 2b between these ratios varies in the order of 50%, 50%, 28% and 11%. The unit cell 2c of 1.0 μm×1.0 μm also has a dimension which is not more than a point spread function range of the image formation optical system 4.

When the second optical modulation element 2 according to the first embodiment is used, as shown in FIG. 4B, a unit light intensity distribution having a peak shape is formed on the surface (the irradiation target surface) of the processed substrate 5 set at the image surface position of the image formation optical system 4 in accordance with the repeated unit area 2d of the phase pattern. This unit light intensity distribution has a central peak shape in which a light intensity is maximum in accordance with a position of the cross section A where the area share ratio of the modulation phase area 2b is 0% and the light intensity is substantially zero in accordance with a position of the cross section A where the area share ratio of the modulation phase area 2b is 50%.

Comparing the light intensity distributions shown in FIGS. 3B and 4B, it can be understood that a gradient of the light intensity distribution having the central peak share formed by using the second optical modulation element 2 is larger than a gradient of the chevron light intensity distribution in the V-shape formed by using the first optical modulation element 1. The light intensity distributions shown in these drawings are calculated on the assumption that a wavelength λ of a light is 248 nm, an image side numeral aperture NA of the image formation optical system 4 is 0.13, and a value σ (a coherence factor) of the image formation optical system 4 is 0.5. The calculation of a light intensity distribution according to the third embodiment presumes the same conditions.

FIGS. 5A and 5B are views schematically showing pulse light emission characteristics of the light source in the first embodiment, and a temporal relationship between the first pulse light which enters the first optical modulation element and the second pulse light which enters the second optical modulation elements. In the first embodiment, as shown in FIG. 5A, a light emission period of a pulse light from the light source 31 is set to 20 nsec. Furthermore, an optical path length difference between an optical path length of the first laser light from the first beam splitter 32 to the first optical modulation element 1 and an optical path length of the second laser light from the beam splitter 32 to the second optical modulation element 2 is set to correspond to a delay time 40 nsec (a distance from the second beam splitter 7 to the first optical modulation element 1 is set to be equal to a distance from the second beam splitter 7 to the second optical modulation element 2). The optical path length difference corresponding to the delay time 40 nsec=40×10$^{-9}$ sec can be calculated by the following Expression (1). As to setting of the delay time, a period until a period in which a molten part (this part is referred to as a maximum value molten portion and it is an area corresponding to an apex of a chevron light intensity distribution) remains without crystallization on the irradiation target surface which is molten and crystallized by the light intensity distribution formed by utilizing at least the first optical modulation element 1 is appropriately selected.

$$\text{(Optical path length difference)} = \text{(Light speed)} \times \text{(Delay time)} \quad (1)$$
$$= (3.0 \times 10^8 \text{ m/sec}) \times (40 \times 10^{-9} \text{ sec})$$
$$= 12 \text{ m}$$

In this manner, an internal structure of the delay optical system 34 comprising a plurality of reflection members is determined in such a manner that the optical path length difference between the optical path length from the beam splitter 32 to the first optical modulation element 1 and the optical path length from the beam splitter 32 to the second optical modulation element 2 becomes approximately 12 m (although a distance between the beam splitter 32 and the first optical modulation element 1 is apparently different from a distance between the beam splitter 32 and the second optical modulation element 2 (excluding a distance of the delay optical system 34) in FIG. 1, these distances are set to be equal to each other). It is desirable to reduce a size of the delay optical system 34 by providing relatively many bent optical paths.

Thus, in the first embodiment, as shown in FIG. 5B, the first pulse light having a light emission time 20 nsec enters the first optical modulation element 1, and the second pulse light having the same light emission time 20 nsec as the first pulse light then enters the second optical modulation element 2 after an elapse of 40 nsec from start of incidence of the first pulse light to the first optical modulation element 1. In order to facilitate understanding, it is assumed that the pulse light emission characteristics of the light source and the temporal relationship between the first pulse light and the second pulse light satisfy the conditions shown in FIG. 5B in other embodiments like the first embodiment.

Figure 6:
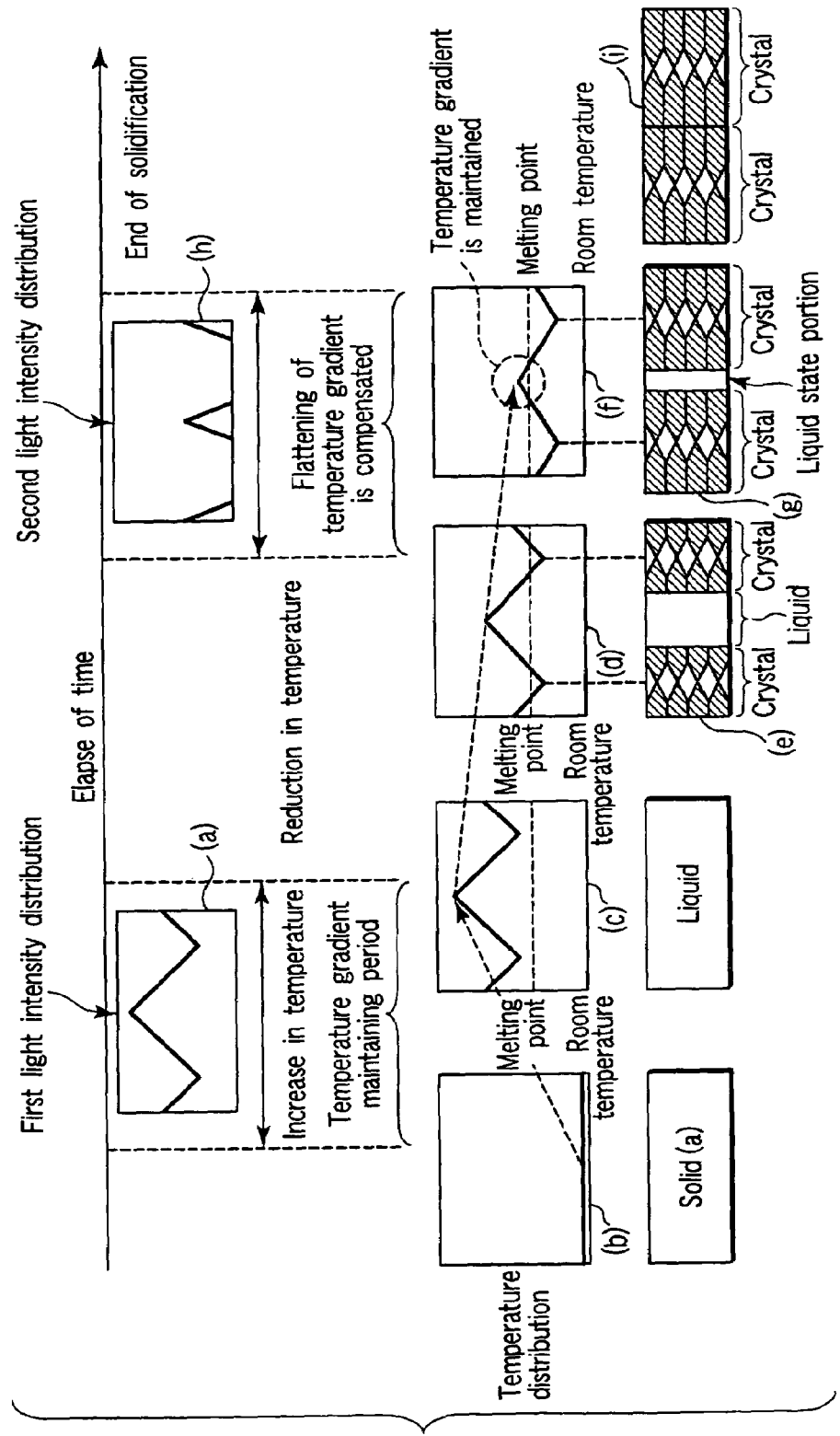
FIG. 6 is a view schematically showing how crystallization advances in the first embodiment.

FIG. 6 is a view schematically showing a state of advance of crystallization in the first embodiment. In the first embodiment, as shown in FIG. 6, the surface of the processed substrate 5 is irradiated with the V-shaped light intensity distribution (the first light intensity distribution) by causing the first pulse light to enter the first optical modulation element 1, thereby forming a V-shaped temperature distribution corresponding to the V-shaped light intensity distribution on the surface of the processed substrate 5. Moreover, before a temperature gradient in a high-temperature region (a peak portion) in the V-shaped temperature distribution is reduced to a temperature which is not more than a melting point due to a drop of a temperature, a maximum temperature portion and the vicinity thereof in the chevron light intensity distribution obtained by the first pulse light is irradiated with a light pattern having a temperature which is not less than the melting point. That is, the second pulse light is caused to enter the second optical modulation element 2 and the surface of the processed substrate 5 is irradiated with the light intensity distribution having the central peak shape (the second light intensity distribution) within a time that the non-single-crystal semiconductor on the processed substrate 5 is partially molten.

As a result, flattening of a temperature gradient with a time can be compensated (corrected) in the high-temperature region in the V-shaped temperature distribution against an influence of thermal diffusion or emission of latent heat by adding a temperature distribution corresponding to the second light intensity distribution having the central peak shape, and a necessary temperature gradient in the high-temperature region can be assuredly maintained even in the final stage of the crystal growth. FIG. 6 shows this state. That is, the first light intensity distribution formed on the non-single-crystal semiconductor through the first optical modulation element 1 is shown in (a). (b) shows a temperature distribution of the non-single-crystal semiconductor 5 before light irradiation, in which an entire surface shows an ordinary temperature and the semiconductor is in a solid state.

Then, when a pulse-like light beam (the first laser light) having the light intensity distribution shown in (a) enters the non-single-crystal semiconductor layer 5, a temperature distribution which is not less than a melting point and shown in (c) is formed on the irradiation target surface of this semiconductor layer 5. That is, the irradiation target surface having a temperature which is not less than the melting point is molten while maintaining the temperature distribution (a liquid state). When the pulse-like light beam irradiation time is terminated, a temperature drop state begins. In the temperature drop process, as shown in (d), when a partial melting point is passed, the crystal growth starts from a crystal nucleus existing in the minimum value portion in the light intensity distribution. This state is shown in (e). Additionally, when the temperature drop advances as shown in (f), the crystal growth proceeds in the horizontal direction, and a state shown in (g) is obtained. In a state where this partially molten area partially remains, the non-single-crystal semiconductor 5 is coaxially irradiated with a light beam of a light intensity distribution shown in (h) having the second light intensity distribution. That is, a molten portion in the irradiation target portion of the non-single-crystal semiconductor 5 corresponding to the maximum value of the first light intensity distribution is irradiated with a light beam (the second laser beam) which has a maximum value equal to or above the melting point of the second light intensity distribution and is shown in FIG. 6(h). In other words, the non-single-crystal semiconductor 5 is irradiated with a light beam which is shown in (f) and demonstrates a high temperature equal to or above the melting point in the liquid state portion shown in (g). As a result, the crystal growth further advances in the horizontal direction even at a crest portion of the chevron light intensity distribution as shown in (i).

In the first embodiment, therefore, since a necessary temperature gradient in the high-temperature region of the V-shaped temperature distribution is assuredly maintained even in the final stage of the crystal growth, the lateral growth of a sufficiently long crystal is realized without termination of the crystal growth before reaching the high-temperature region and without crystallization in the high-temperature region. That is, in the first embodiment, an influence of thermal diffusion or emission of latent heat can be suppressed in the final stage of the crystal growth, and the sufficient crystal growth from a crystal nucleus can be realized, thereby generating a crystallized semiconductor with a large particle size. As a result, a margin of, e.g., a positioning accuracy can be widened.

In the first embodiment, a light beam from one light source 31 is divided into two light beams by the beam splitter 32. However, the present invention is not restricted thereto, and it is possible to adopt a structure in which a light from a first light source is led to the first optical modulation element 1 and a light from a second light source is led to the second optical modulation element 2, and timings of pulse light emission from the two light sources may be shifted.

In the first embodiment, the common image formation optical system 4 is provided between the first optical modulation element 1 and the second optical modulation element 2 and the processed substrate 5. However, the present invention is not restricted thereto, a first image formation optical system which leads a light from the first optical modulation element to the processed substrate 5 and a second image formation optical system which leads a light from the second optical modulation element 2 to the processed substrate 5 may be separately provided. In this case, an optical path combining element which combines two optical paths must be arranged between the first and second image formation optical systems and the processed substrate 5.

Figure 7:
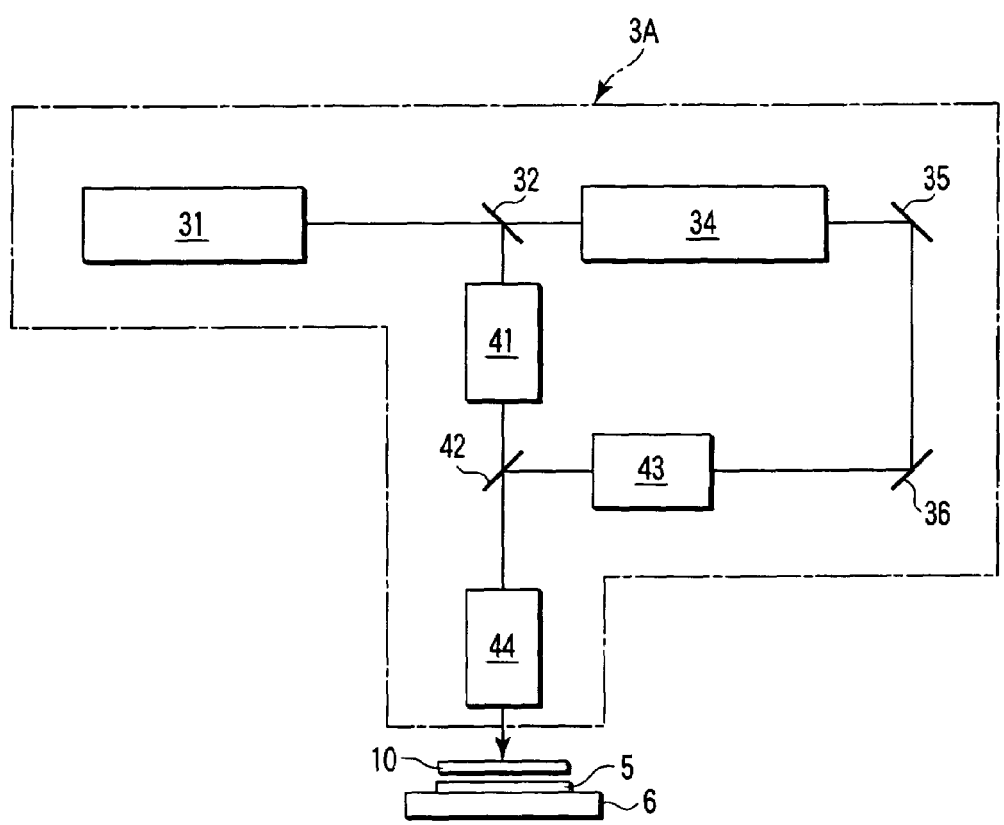
FIG. 7 is a view schematically showing a structure of a crystallization apparatus according to a second embodiment of the present invention.
Figure 8A:
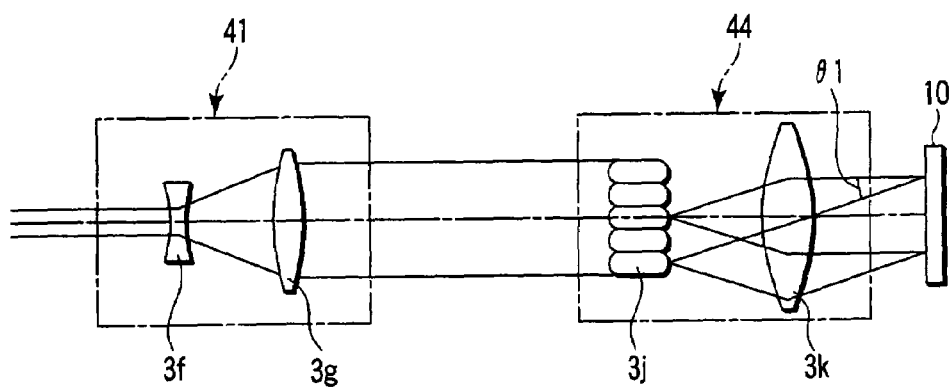
FIGS. 8A and 8B are views schematically showing internal structures of a first illumination optical system and a second illumination optical system depicted in FIG. 7, respectively.
Figure 8B:
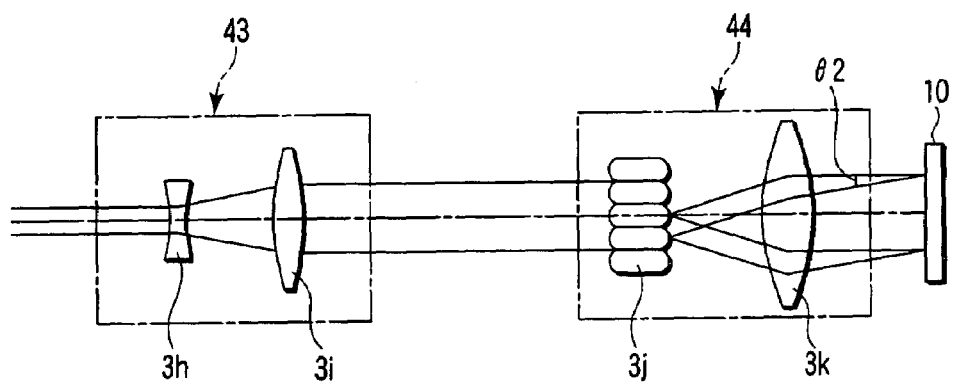

FIG. 7 is a view schematically showing a structure of a crystallization apparatus according to a second embodiment of the present invention. FIGS. 8A and 8B are views schematically showing internal structures of a first illumination optical system and a second illumination optical system depicted in FIG. 7. Referring to FIG. 7, the crystallization apparatus according to the second embodiment is an apparatus which complies with a proximity (defocus) method (a method which applies a Fresnel diffraction pattern generated in proximity exposure) using no image formation optical system, and comprises an illumination system 3A, a substrate stage 6 on which a processed substrate 5 is mounted, and an optical modulation element 10 which is arranged between these members and common to a first pulse light (a first laser light) and a second pulse light (a second laser light). In FIG. 7, like reference numerals denote elements having the same functions as those of the constituent elements in FIG. 1.

In the illumination system 3A, a laser light emitted from a light source 31 enters a beam splitter 32. A light (a first laser light) reflected by the beam splitter 32 enters an optical path combining element 42 such as a beam splitter through a first shaping optical system 41. On the other hand, a light (a second laser light) transmitted through the beam splitter 32 enters the optical path combining element 42 through a delay optical system 34, a pair of mirrors 35 and 36 and a second shaping optical system 43. The first laser light transmitted through the optical path combining element 42 passes through the common illumination optical system 44 and then illuminates a common optical modulation element 10 as a first pulse light. Likewise, the second laser light reflected by the optical path combining element 42 passes through the common illumination optical system 44 and then illuminates the common optical modulation element 10 as a second pulse light.

In the second embodiment, the first shaping optical system 41 which magnifies a diameter of the first laser light with a first magnifying power and the common illumination optical system 44 constitute a first illumination optical system which causes the first pulse light having a first angular distribution (an angular width) to enter the common optical modulation element 10. Further, the second shaping optical system 43 which magnifies a diameter of the second laser light with a second magnifying power smaller than the first magnifying power and the common illumination optical system 44 constitute a second illumination optical system which causes the second pulse light having a second angular distribution (an angular width) different from the first angular distribution to enter the common optical modulation element 10. As shown in FIG. 8A, the first shaping optical system 41 has a negative lens group 3f and a positive lens group 3g in the order from the light source. Likewise, the second shaping optical system 43 has a negative lens group $3h$ and a positive lens group $3i$ in the order from the light source as shown in FIG. 8B.

As shown in FIGS. 8A and 8B, the common illumination optical system 44 has a fly-eye lens $3j$ and a condenser optical system $3k$ in the order from the light source. Here, the common illumination optical system 44 is constituted in such a manner that a rear focal surface of the fly-eye lens $3j$ substantially matches with a front focal surface of the condenser optical system $3k$. A light beam (the first laser light) whose diameter has been magnified by the first shaping optical system 41 performs Koehler illumination with respect to the common modulation element 10 as a first pulse light having a maximum incidence angle θ1 with a homogenized illumination distribution through the common illumination optical system 44. Likewise, a light beam (the second laser light) whose diameter has been magnified by the second shaping optical system 43 performs Koehler illumination with respect to the common optical modulation element 10 as a second pulse light having a maximum incidence angle θ2 with a homogenized illumination distribution through the common illumination optical system 44. In this case, since a magnifying power of the first shaping optical system 41 is set larger than a magnifying power of the second shaping optical system 43, a light beam which enters the fly-eye lens $3j$ through the first shaping optical system 41 has a larger than cross section than that of a light beam which enters the fly-eye lens $3j$ through the second shaping optical system 43.

As a result, the maximum incidence angle θ1 of the first pulse light which enters the common optical modulation element 10 through the first shaping optical system 41 becomes larger than the maximum incidence angle θ2 of the second pulse light which enters the common optical modulation element 10 through the second shaping optical system 43. That is because the maximum incidence angle of the light which enters the common optical modulation element 10 depends on a cross-sectional size of a light beam at an exist surface of the fly-eye lens $3j$ which determines an exit pupil of the common illumination optical system 44. In the following simulation, it is assumed that the maximum incidence angle θ1 of the first pulse light is 2.1 degrees and the maximum incidence angle θ2 of the second pulse light is 1.0 degree.

FIGS. 9A and 9B are views schematically showing a positional relationship between the common optical modulation element and the processed substrate in the second embodiment, and a part of a phase pattern of the common optical modulation element, respectively. FIG. 10 is a view schematically showing a light intensity distribution formed on the processed substrate when the first pulse light is caused to enter the common optical modulation element in the second embodiment. FIG. 11 is a view schematically showing a light intensity distribution formed on the processed substrate when the second pulse light is caused to enter the common optical modulation element in the second embodiment. The common optical modulation element 10 is arranged in proximity to the processed substrate with a gap of 155 μm from the surface of the processed substrate 5 as shown in FIG. 9A.

Furthermore, as shown in FIG. 9B, the common optical modulation element 10 is a so-called line type phase shifter, and comprises two rectangular areas 10a and 10b which are alternately repeated in one direction or the lateral direction. In this example, each of the two areas 10a and 10b has a widthwise dimension of, e.g., 10 μm, and a phase difference of 180 degrees is provided between the two areas 10a and 10b. In the common optical modulation element 10, a linear boundary 10c between the two areas 10a and 10b having a phase difference of 180 degrees constitutes a phase shift line.

When the first pulse light having the maximum incidence angle θ1=2.1 degrees enters the common optical modulation element 10, as shown in FIG. 10B, a substantially chevron light intensity distribution (a first light intensity distribution) which is similar to the light intensity distribution shown in FIG. 3B and corresponds to an intensity distribution between minimum intensity portions of adjacent V-shaped unit intensity distributions is formed on the surface of the processed substrate 5 arranged in proximity to the optical modulation element 10. FIG. 10B shows a unit light intensity distribution formed by the respective areas 10a and 10b, and a light intensity distribution consisting of a plurality of unit light intensity distributions in which the unit light intensity distributions are coupled in the lateral direction can be actually obtained on the processed substrate 5. As can be understood from this drawing, there is formed a substantially chevron light intensity distribution in which a light intensity is minimum in accordance with the phase shift line 10c and the light intensity is maximum in accordance with a central area (a central area of the area 10b) of the two phase shift lines 10c.

On the other hand, when the second pulse light having the maximum incidence angle θ2=1.0 degree enters the common optical modulation element 10, as shown in FIG. 11, a light intensity distribution (a second light intensity distribution) having a substantially central peak shape which is similar to the light intensity distribution depicted in FIG. 4B is formed on the surface of the processed substrate 5. That is, there is formed a light intensity distribution having a substantially central peak shape in which a light intensity is substantially zero in accordance with the phase shift line 10c and the light intensity is maximum in accordance with an intermediate position of the two phase shift lines 10c. The light intensity distributions shown in FIGS. 10 and 11 are calculated on the assumption that a wavelength λ of a light is 248 nm.

In this manner, flattening of a temperature gradient with time in a high-temperature region in the V-shaped temperature distribution can be compensated against an influence of thermal diffusion or emission of latent heat by adding a temperature distribution corresponding to the second light intensity distribution having a substantially central peak shape in the second embodiment like the first embodiment. As a result, in the second embodiment, likewise, an influence of thermal diffusion or emission of latent heat in the final stage of the crystal growth can be suppressed, and the sufficient crystal growth from a crystal nucleus can be realized, thereby generating a crystallized semiconductor of a crystal grain having a large particle size.

In the second embodiment, a light beam from one light source 31 is divided into two light beams by a beam splitter 32. However, the present invention is not restricted thereto and, for example, in a structure in which a light from a first light source is led to the common optical modulation element 10 through the first shaping optical system 41 and the common illumination optical system 44 and a light from a second light source is led to the common optical modulation element 10 through a delay optical system 34, the second shaping optical system 43 and the common illumination optical system 44, timings of pulse light emission from the two light sources may be shifted from each other.

Moreover, in the second embodiment, the common optical modulation element 10 and the processed substrate 5 are arranged in proximity to each other. However, the present invention is not restricted thereto, and it is possible to adopt a structure in which the same image formation optical system as the first embodiment is provided between the common optical modulation element 10 and the processed substrate 5, for example.

Figure 12:
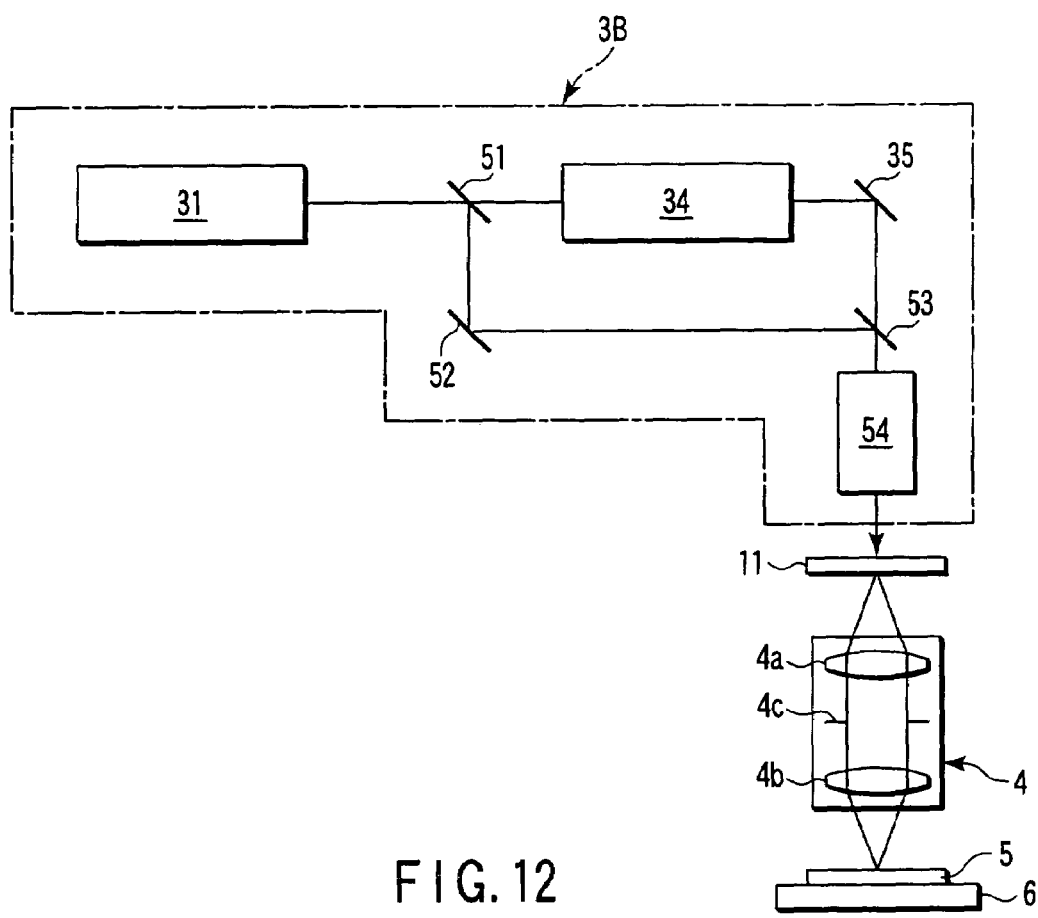
FIG. 12 is a view schematically showing a structure of a crystallization apparatus according to a third embodiment of the present invention.

FIG. 12 is a view schematically showing a structure of a crystallization apparatus according to a third embodiment of the present invention. Referring to this drawing, the crystallization apparatus comprises an illumination system 3B, a substrate stage 6 on which a processed substrate 5 is mounted, and a common optical modulation element 11 and an image formation optical system 4 which are sequentially arranged between the illumination system 3B and the processed substrate 5 and common to a first pulse light (a first laser light) and a second pulse light (a second laser light). In FIG. 12, like reference numerals denote elements having the same functions as those of the constituent elements depicted in FIG. 1.

In this illumination system 3B, a laser light exiting from a light source 31 enters a polarizing beam splitter 51. This polarizing beam splitter 51 reflects a light component of S polarization and transmits a light component of P polarization therethrough. A light component or a light beam (the first laser light) of S polarization reflected by the polarized beam splitter 51 enters an optical path combining element 53 such as a polarizing beam splitter through a mirror 52, and is reflected by this optical path combining element 53. On the other hand, a light component or a light beam (the second laser light) of P polarization transmitted through the polarizing beam splitter 51 enters the optical path combining element 53 through the delay optical system 34 and a mirror 35. The first laser light reflected by the optical path combining element 53 is transmitted through a common illumination optical system 54 having, e.g., an internal structure shown in FIG. 2, and then illuminates the common optical modulation element 11 as the first pulse light in the S polarization state. The second laser light transmitted through the optical path combining element 53 is transmitted through the common illumination optical system 54, and then illuminates the common optical modulation element 11 as the second pulse light in the P polarization state. In this example, the S polarization is defined as that an electric field vector of a light is vertical to the page space and the P polarization is defined as that an electric field vector of a light is parallel to the page space, and so forth.

Figure 13A:
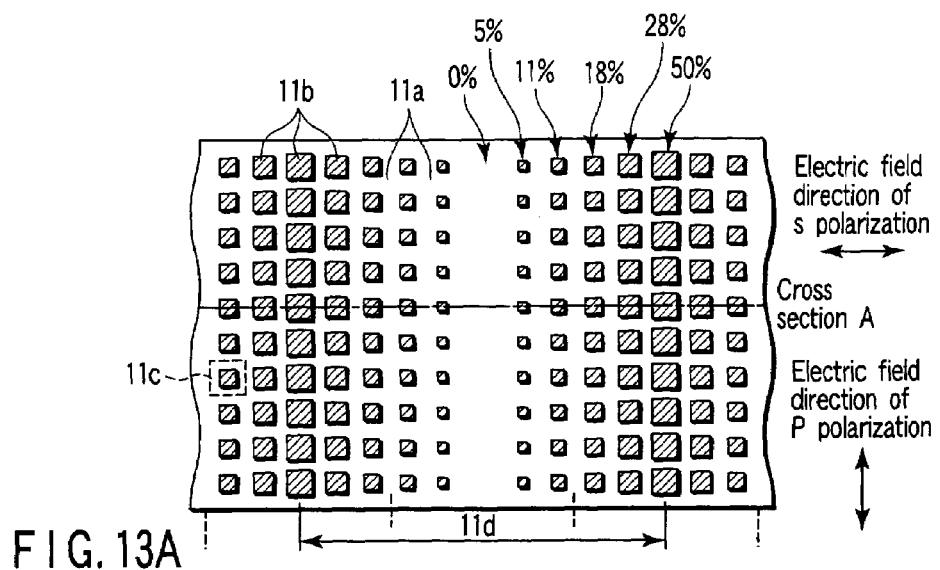
Figure 13B:
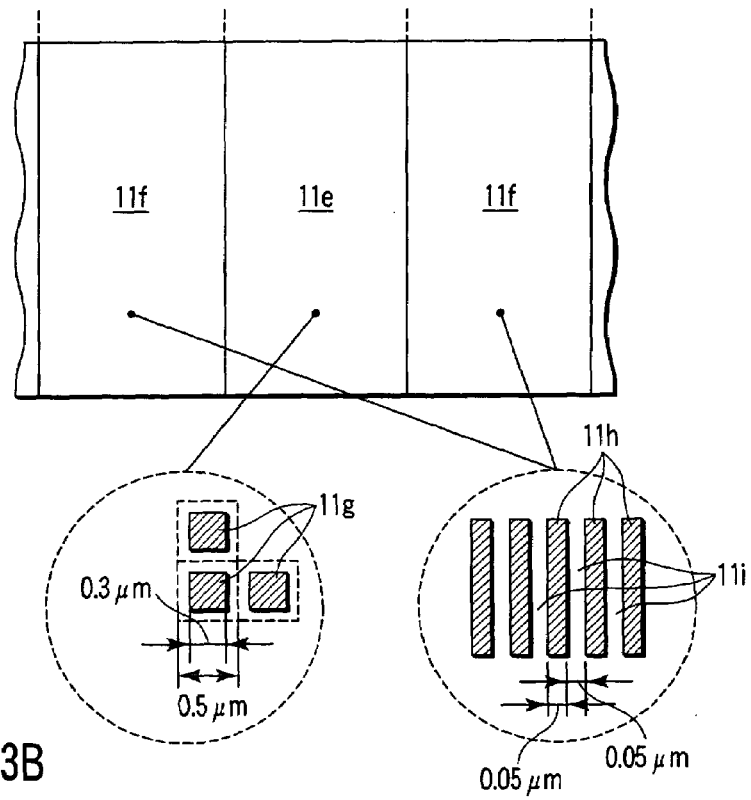

FIGS. 13A and 13B are views schematically showing a phase pattern of the common optical modulation element in the third embodiment, and a part of an electroconductive pattern, respectively. FIG. 14 is a view schematically showing a unit light intensity distribution formed on the processed substrate when the first pulse light is caused to enter the common optical modulation element in the third embodiment. Further, FIG. 15 is a view schematically showing a unit light intensity distribution formed on the processed substrate when the second pulse light is caused to enter the common optical modulation element in the third embodiment. The common optical modulation element 11 in the third embodiment has the phase pattern depicted in FIG. 13A, and a pattern comprising an electroconductive film pattern shown in FIG. 13B.

The phase pattern of the common optical modulation element 11 basically has the same structure as the phase pattern of the first optical modulation element according to the first embodiment shown in FIG. 3A. That is, the phase pattern of the common optical modulation element 11 has a reference phase area (indicated by a blank portion in the drawing) 11a having a reference phase value of 0 degree, and each rectangular modulation phase area (indicated by a shaded portion in the drawing) 11b having a modulation phase value of 90 degrees. Here, the modulation phase areas 11b are arranged in the vertical and horizontal directions in accordance with a pitch of 1.0 μm (an image surface reduced value of the image formation optical system 4).

An area share ratio (a duty) of the modulation phase area 11*b* with respect to a unit cell 11*c* of 1.0 μm×1.0 μm varies between 0% and 50% along the horizontal direction in the drawing (along a cross section A). Specifically, an area share ratio of the modulation phase area 11*b* on the both sides of a repeated unit area 11*d* of the phase pattern is 50%, whilst an area share ratio of the modulation phase area 11*b* at the center of the repeated unit area 11*d* is 0%, and an area share ratio of the modulation phase area 11*b* between these ratios varies in the order of 28%, 18%, 11% and 5%.

On the other hand, an electroconductive film pattern of the common optical modulation element 11 has two types of pattern areas 11*e* and 11*f* which are alternately repeated along the direction of the cross section A of the phase pattern. In a first area 11*e*, square dot patterns 11*g* formed of chrome having a thickness of 0.05 μm and a size of 0.3 μm×0.3 μm (an image surface reduced value of the image formation optical system 4) are formed in the vertical and horizontal directions or in a matrix shape in accordance with a pitch of 0.5 μm (an image surface reduced value of the image formation optical system 4). In a second area 11*f*, a line-and-space pattern having a pitch direction is formed in the direction of the cross section A of the phase pattern or in the lateral direction.

In this example, the line-and-space pattern of the second area 11*f* comprises a strip-like line portion 11*h* consisting of chrome having a thickness of 0.05 μm and a widthwise dimension of 0.05 μm (an image surface reduced value of the image formation optical system 4), and a light-permeable space portion 11*i* having a widthwise dimension of 0.05 μm (an image surface reduced value of the image formation optical system 4). The first area 11*e* of the electroconductive film pattern is formed to correspond to a central position of the repeated unit area 11*d* of the phase pattern. The second area 11*f* of the electroconductive film pattern is formed to have substantially the same widthwise dimension as that of the first area 11*e* of the electroconductive film pattern along the direction of the cross section A of the phase pattern.

The common optical modulation element 11 is positioned in such a manner that a direction of an oscillation surface (a direction of an electric field) of the first pulse light which enters in the S polarization state matches with the direction of the cross section A of the phase pattern.

When manufacturing the common optical modulation element 11, it is desirable to form the phase pattern and the electroconductive film pattern on the same surface of one substrate. One example of this formation is shown in FIG. 13C. In this common optical modulation element 11, an electroconductive film is formed on one surface of a transparent substrate, and this film is selectively etched, thereby forming electroconductive film patterns 11*f* and 11*e*. A film consisting of a transparent material is formed on these patterns, and this film is selectively etched, thereby forming a phase pattern comprising a reference phase area 11*a* and a modulation phase area 11*b*. The optical modulation element 11 may be also constituted by forming a phase pattern on one surface of one transparent substrate, forming an electroconductive film pattern on one surface of the other transparent substrate and attaching the both substrates on their surfaces on one side.

In the common optical modulation element 11 according to the third embodiment, the line-and-space pattern (11*h* and 11*i*) has a pitch smaller than a wavelength of a light (248 nm=0.248 μm). Furthermore, chrome constituting the line portion 11*h* of the line-and-space pattern (11*h* and 11*i*) is a conductor. Therefore, a light of P polarization having an oscillation surface along a direction orthogonal to a pitch direction of the line-and-space pattern (11*h* and 11*i*) is reflected without being substantially transmitted through the second area 11*f* of the electroconductive film pattern.

On the other hand, in the first area 11*e* of the electroconductive film pattern having a chrome dot pattern formed thereto, a transmission factor of a light is fixed without being dependent on the polarization state. As described above, in the first area 11*e* of the electroconductive film pattern, both a transmission factor with respect to the first pulse light in the S polarization state and a transmission factor with respect to the second pulse light in the P polarization state are 40%. However, in the second area 11*f* of the electroconductive film pattern, a transmission factor with respect to the first pulse light in the S polarization state is 40%, but a transmission factor with respect to the second pulse light in the P polarization state is as very small as 2%. That is, the second area 11*f* of the electroconductive film pattern is a pattern area in which a transmission factor varies depending on the polarization state of an incident light beam.

Therefore, when the first pulse light in the S polarization state enters the common optical modulation element 11, as shown in FIG. 14, a chevron (the both sides have a V shape) light intensity distribution (the first light intensity distribution) similar to the light intensity distribution depicted in FIG. 3B is formed on the surface of the processed substrate 5 set at the image surface position of the image formation optical system 4. That is, there is formed a V-shaped light intensity distribution in which a light intensity is minimum in accordance with a position of the cross section A where an area share ratio of the modulation phase area 11*b* is 50% and the light intensity is maximum in accordance with a position of the cross section A where an area share ratio of the modulation phase area 11*b* is 0%. It is to be noted that FIG. 14 shows a chevron light intensity distribution corresponding to the repeated unit area 11*d* of the phase pattern in a plurality of V-shaped light intensity distributions continuously formed along the direction of the cross section A.

On the other hand, when the second pulse light in the P polarization state enters the common optical modulation element 11, as described above, although a light is excellently transmitted through the first area 11*e* of the electroconductive film pattern, a light is rarely transmitted through the second area 11*f* of the electroconductive film pattern. As a result, as shown in FIG. 15, a light intensity distribution having a substantially peak shape (the second light intensity distribution) which substantially corresponds to the central portion alone of the chevron light intensity distribution depicted in FIG. 14 is formed on the surface of the processed substrate 5.

As described above, in the third embodiment, flattening of a temperature gradient with time in a high-temperature region of a V-shaped temperature distribution (an apex of a chevron temperature distribution) can be compensated against an influence of thermal diffusion or emission of latent heat by adding a temperature distribution corresponding to the second light intensity distribution having the substantially central peak shape like the first and second embodiments. As a result, in the third embodiment, likewise, an influence of thermal diffusion or emission of latent heat in the final stage of the crystal growth can be suppressed, and the sufficient crystal growth from a crystal nucleus can be realized, thereby generating a crystallized semiconductor of a crystal grain with a large particle size.

Figure 16A:
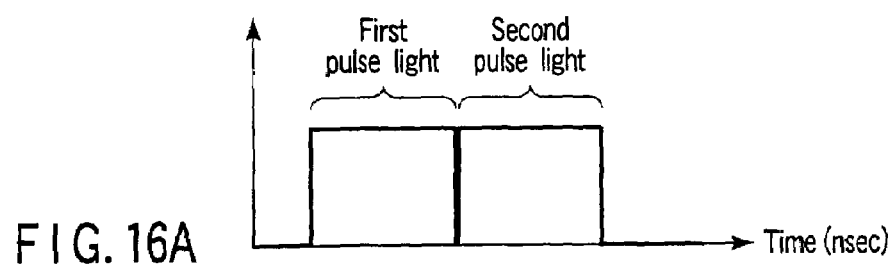
FIGS. 16A and 16B are views schematically showing different modifications of a time relationship between the first pulse light and the second pulse light, respectively.
Figure 16B:
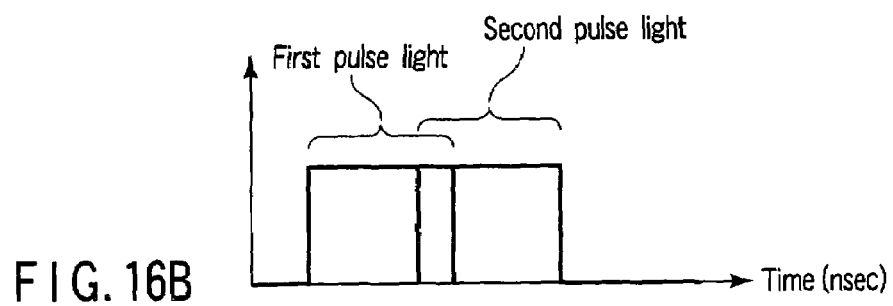

In each of the foregoing embodiments, as shown in FIG. 5B, a time interval of 20 nsec is assured between irradiation of the first pulse light with respect to the optical modulation elements 1, 10 and 11 and irradiation of the second pulse light with respect to the optical modulation elements 2, 10 and 11. However, irradiation timings of the both pulse lights are not restricted thereto, and irradiation of the first pulse light with respect to the optical modulation elements 1, 10 and 11 and irradiation of the second pulse light with respect to the optical modulation elements 2, 10 and 11 may be temporally substantially continuous as shown in FIG. 16A, for example. Moreover, as shown in FIG. 16B, irradiation of the first pulse light and irradiation of the second pulse light may temporally partially overlap. In the foregoing embodiments, the first embodiment is an example in which a light beam having different distributions, i.e., the light intensity distribution of the first irradiation and the light intensity distribution of the second irradiation is emitted. The second and third embodiments are examples in which a light beam having the same light intensity distribution is emitted.

Figures 17A, 17B, 17C, 17D, 17E:
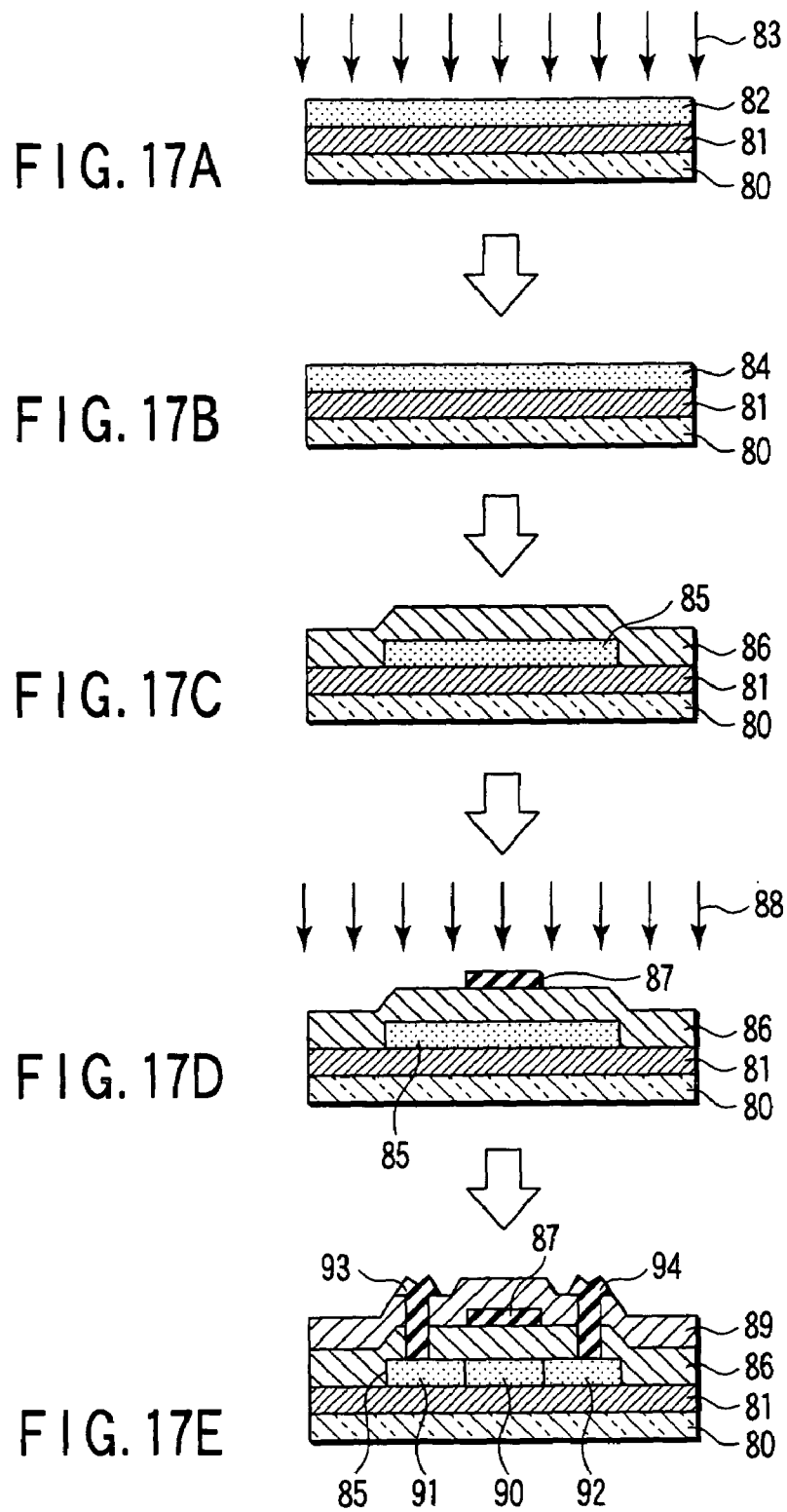
FIGS. 17A to 17E are process cross-sectional views showing processes for manufacturing an electronic device by using a crystallization apparatus according to this embodiment.
Figure 19:
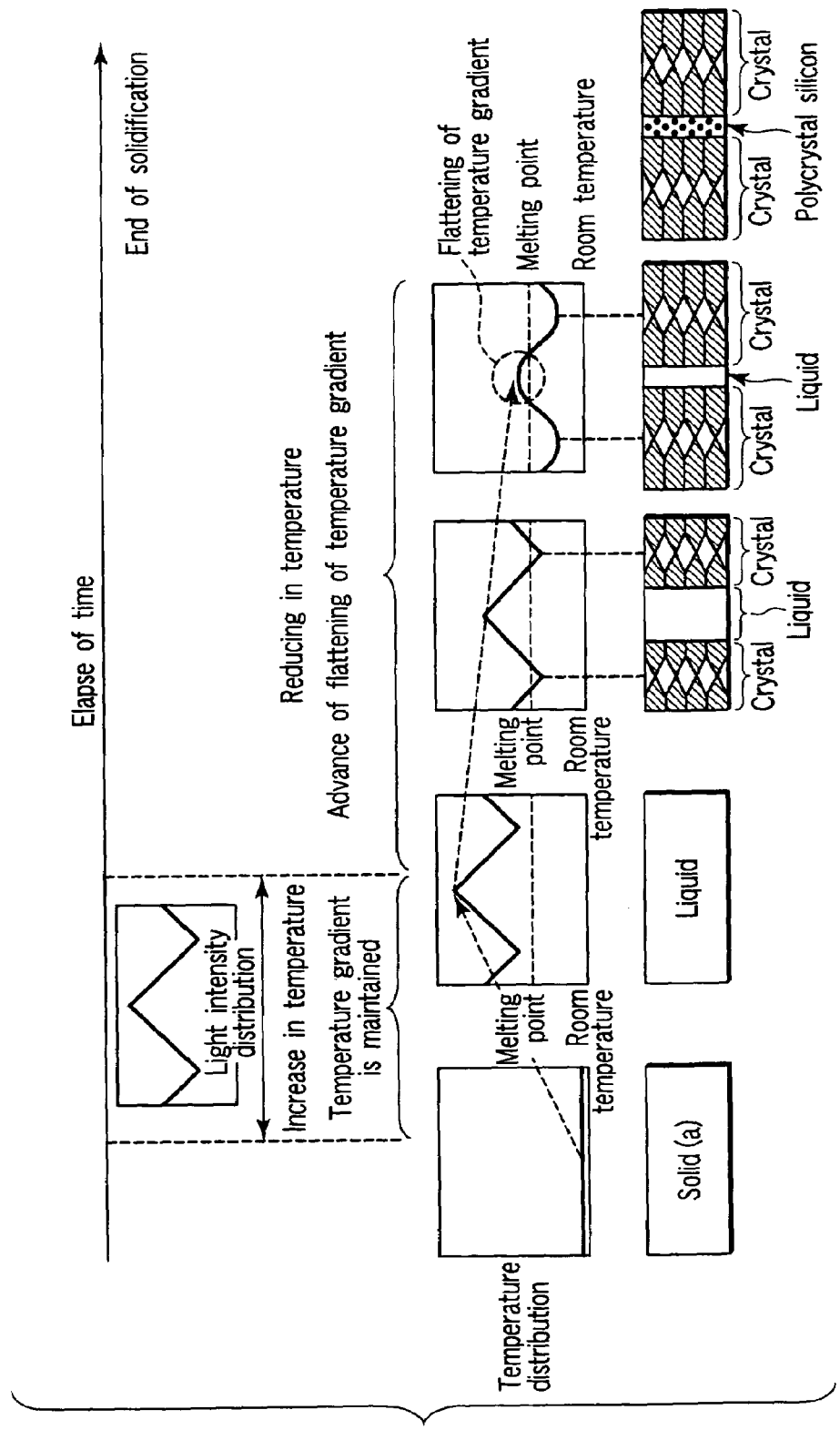
FIG. 19 is a view schematically showing a state of advance of crystallization of a-Si involved by a change in temperature distribution depicted in FIG. 18D.
Figure 20:
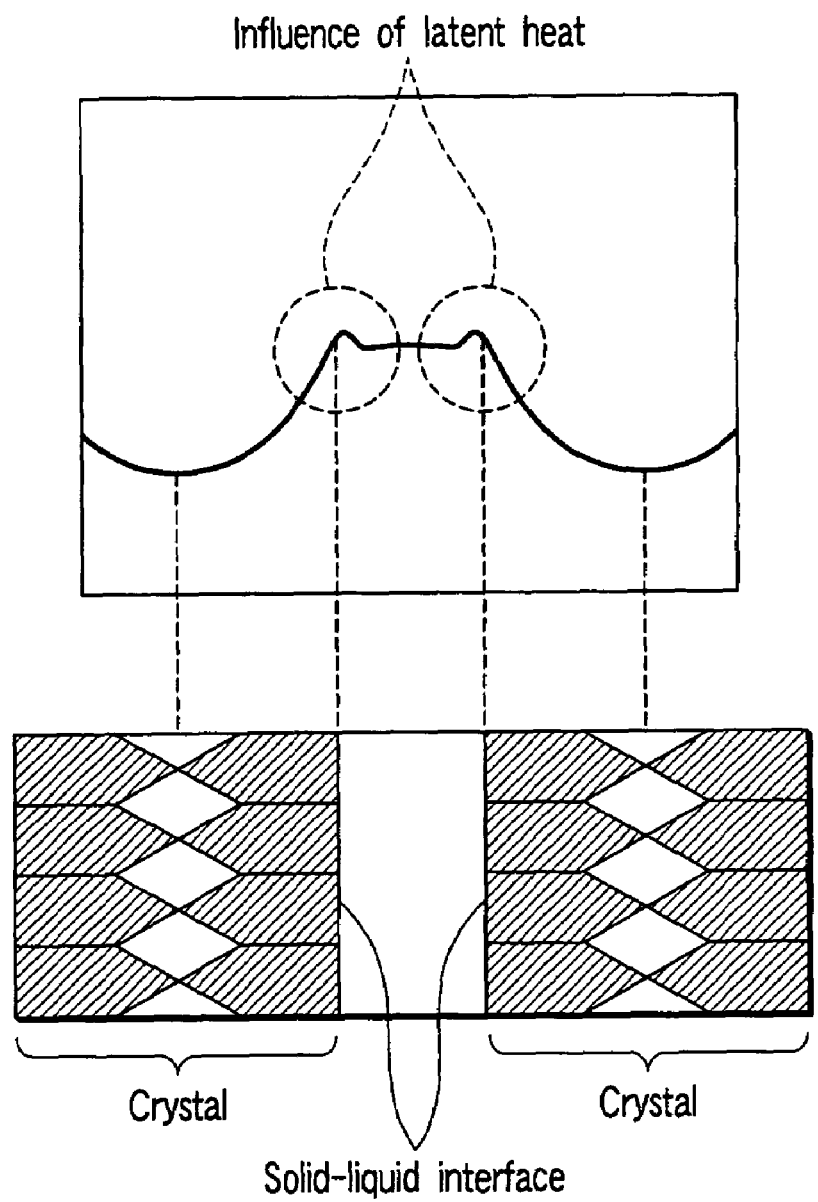
FIG. 20 is a view schematically illustrating an inconvenience of a prior art when affected by latent heat.

FIGS. 17A to 17E are process cross-sectional views showing processes for manufacturing an electronic device in an area crystallized by utilizing the crystallization apparatus according to this embodiment. As shown in FIG. 17A, there is prepared a processed substrate 5 obtained by forming an underlying film 81 (e.g., a laminated film of SiN having a film thickness of 50 nm and $SiO_2$ having a film thickness of 100 nm), an amorphous semiconductor film 82 (e.g., Si, Ge or SiGe having a film thickness of approximately 50 nm to 200 nm) and a non-illustrated cap film 82a (e.g., an $SiO_2$ film having a film thickness of 30 nm to 300 nm) on a transparent insulating substrate 80 (e.g., alkali glass, quartz glass, plastic or polyimide) by using a chemical vapor deposition method, a sputtering method or the like. Then, a laser light 83 (e.g., a KrF excimer laser light or an XeCl excimer laser light) is applied to a predetermined area of the surface of the amorphous semiconductor film 82.

In this manner, as shown in FIG. 17B, a polycrystal semiconductor film or a single-crystallized semiconductor film 84 having a crystal with a large particle size is generated. Subsequently, after the cap film 82a is removed by etching, as shown in FIG. 17C, the polycrystal semiconductor film or the single-crystallized semiconductor film 84 is processed into an island-shaped semiconductor film 85 which becomes an area in which, e.g., a thin film transistor is formed by utilizing a photolithography technique, and an $SiO_2$ film having a film thickness of 20 nm to 100 nm is formed on the surface as a gate insulating film 86 by using the chemical vapor deposition method, the sputtering method or the like. Additionally, as shown in FIG. 17D, a gate electrode 87 (e.g., silicide or MoW) is formed on the gate insulating film, and an impurity ion 88 (phosphor in case of an N channel transistor, and boron in case of a P channel transistor) is implanted with the gate electrode 87 being used as a mask. Thereafter, annealing processing (e.g., one hour at 450° C.) is performed in a nitrogen atmosphere so that the impurity is activated, and a source area 91 and a drain area 92 are formed to the island-shaped semiconductor film 85. Then, as shown in FIG. 17E, an interlayer insulating film 89 is formed, contact holes are formed, and a source electrode 93 and a drain electrode 94 which are connected with a source 91 and a drain 92 coupled through a channel 90 are formed.

In the above-described processes, the channel 90 is formed in accordance with a position of a crystal with a large particle size of the polycrystal semiconductor film or the single-crystallized semiconductor film 84 generated in the processes shown in FIGS. 17A and 17B. With the above-described processes, a thin film transistor (TFT) can be formed to a polycrystal transistor or a single-crystallized semiconductor. The thus manufactured polycrystal transistor or single-crystallized transistor can be applied to a drive circuit for a liquid crystal display unit (display) or an EL (electroluminescence) display, an integrated circuit for a memory (an SRAM or a DRAM) or a CPU.

In the foregoing embodiments, although the phase modulation element is used as the first optical modulation element, the present invention is not restricted thereto as long as the phase modulation element is an optical element capable of performing modulation to, e.g., transmit, reflect, refract and/or diffract an incident light in such a manner that V-shaped light intensity distributions aligned with a chevron unit light intensity distribution defined therebetween are formed on an irradiation target surface. Likewise, the second optical modulation element is not restricted to the phase modulation element as long as it can perform optical modulation with respect to an incident light in such a manner that a light intensity distribution having an intensity peak value corresponding to an apex of the chevron unit light intensity distribution is provided on an irradiation target surface.

What is claimed is:

1. A crystallization apparatus comprising:
   a first optical modulation element which irradiates a non-single-crystal substance with a light beam which is to have a first light intensity distribution on the non-single crystal substance by modulating an intensity of an incident first light beam, thereby melting the non-single-crystal substance, the first light intensity distribution having a plurality of V-shaped intensity patterns;
   a second optical modulation element which irradiates the non-single-crystal substance with a light beam which is to have a second light intensity distribution substantially different from the first light intensity distribution on the non-single-crystal substance by modulating an intensity of an incident second light beam, thereby melting the non-single-crystal substance, the second light intensity distribution having a plurality of patterns each having a central peak shape; and
   a delay optical illumination system which causes the light beam having the second light intensity distribution to enter at least a portion of the molten part of the non-single-crystal substance that is generated by the light beam having the first light intensity distribution, before a temperature of the molten part is reduced to a temperature not more than a melting point.

2. A crystallization apparatus comprising:
   a first optical modulation element which irradiates a non-single-crystal substance with a first light beam which is to have on the non-single-crystal substance a light intensity distribution having at least two V-shaped unit intensity distributions which are adjacent to define a chevron unit light intensity distribution therebetween by modulating an intensity of the incident first light beam, thereby melting the non-single-crystal substance;
   a second optical modulation element which irradiates the non-single-crystal substance with a second light beam which is to have a second light intensity distribution on the non-single-crystal substance by modulating an intensity of the incident second light beam, thereby melting the non-single-crystal substance, the second light intensity distribution having at least two patterns each having a central peak shape; and
   an illumination system including a light source, a beam splitter for dividing a light beam from the light source into the first and second light beams, and a delay optical system which irradiates a part of the non-single-crystal substance molten by the first light beam with the second light beam after an elapse of a predetermined time from start of irradiation of the first light beam.

3. The crystallization apparatus according to claim 1, wherein the illumination system has: a light source which emits an illumination light beam; a beam splitter which divides a light beam emitted from the light source into the first light beam and the second light beam; a first optical system which leads the first light beam from the beam splitter to the first optical modulation element; and a second optical system which leads the second light beam from the beam splitter to the second optical modulation element.

4. The crystallization apparatus according to claim 1, wherein the first optical modulation element and the second optical modulation element are a common single optical modulation element, and the illumination system causes the first light beam having a first angular distribution to enter the common optical modulation element, and then causes the second light beam having a second angular distribution substantially different from the first angular distribution to enter the common optical modulation element.

5. The crystallization apparatus according to claim 4, wherein the illumination system has: a light source which emits an illumination light beam; a beam splitter which divides a light beam emitted from the light source into the first and second light beams; a first shaping optical system which shapes the first light beam from the beam splitter and leads the shaped light beam to a predetermined position; a second shaping optical system which has an optical path length longer than that of the first shaping optical system, shapes the second light beam from the beam splitter and leads the shaped light beam to the predetermined position; an optical path combining element which is arranged at the predetermined position and combines an optical path of the light beam transmitted through the first shaping optical system with an optical path of the light beam transmitted through the second shaping optical system; and a common illumination optical system which is arranged between the optical path combining element and the common optical modulation element.

6. The crystallization apparatus according to claim 1, wherein the first and second light beams respectively have first and second polarization states different from each other, the first optical modulation element and the second optical modulation element being a common single optical modulation element, and the illumination system causes the first light beam having the first polarization state to enter the common optical modulation element, and then causes the second light beam having the second polarization state to enter the common optical modulation element.

7. The crystallization apparatus according to claim 6, wherein the illumination system has: a light source which emits an illumination light beam; a polarizing beam splitter which divides a light beam emitted from the light source into a first light beam having an S polarization component and a second light beam having a P polarization component; a first optical system which leads the first light beam of the S polarization reflected by the beam splitter to a predetermined position; a second optical system which has an optical path length longer than that of the first optical system and leads the second light beam of the P polarization transmitted through the beam splitter to the predetermined position; an optical path combining element which is arranged at the predetermined position and combines an optical path of the light beam of the S polarization transmitted through the first optical system with an optical path of the light beam of the P polarization transmitted through the second optical system; and a common illumination optical system which is arranged between the optical path combining element and the common optical modulation element.

8. The crystallization apparatus according to claim 6, wherein the common optical modulation element includes a pattern area in which a transmission factor with respect to the first light beam having the first polarization state is substantially different from a transmission factor with respect to the second light beam having the second polarization state.

9. The crystallization apparatus according to claim 1, further comprising a common image formation optical system which is arranged between the first and second optical modulation elements and the non-single-crystal substance and irradiates the non-single-crystal substance with the first and second light beams.

* * * * *